(12) United States Patent
Yamaguchi et al.

(10) Patent No.: US 11,817,732 B2
(45) Date of Patent: Nov. 14, 2023

(54) CHARING CONTROLLER, RECHARGEABLE BATTERY, ELECTRONIC DEVICE, AND CONTROL METHOD

(71) Applicant: Lenovo (Singapore) Pte. Ltd., Singapore (SG)

(72) Inventors: Hiromitsu Yamaguchi, Kanagawa (JP); Tadashi Kosuga, Kanagawa (JP); Hideki Otsuki, Kanagawa (JP); Koichi Fukuoka, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 190 days.

(21) Appl. No.: 17/328,434

(22) Filed: May 24, 2021

(65) Prior Publication Data
US 2021/0399567 A1 Dec. 23, 2021

(30) Foreign Application Priority Data
Jun. 22, 2020 (JP) ................... 2020-107348

(51) Int. Cl.
*H02J 7/00* (2006.01)
(52) U.S. Cl.
CPC ...... *H02J 7/0049* (2020.01); *H02J 7/007182* (2020.01)
(58) Field of Classification Search
CPC .................................................. H02J 7/0049
See application file for complete search history.

(56) References Cited

U.S. PATENT DOCUMENTS

| 2004/0012373 | A1 | 1/2004 | Sakakibara et al. |
| 2010/0201323 | A1 | 8/2010 | Okamura |
| 2012/0121952 | A1 | 5/2012 | Majima et al. |
| 2016/0190843 | A1* | 6/2016 | Yang ............... G01R 31/36 320/152 |

(Continued)

FOREIGN PATENT DOCUMENTS

| JP | H06-059003 A | 3/1994 |
| JP | 2000-285968 A | 10/2000 |
| JP | 2001-257008 A | 9/2001 |

(Continued)

OTHER PUBLICATIONS

Extended European Search Report issued in corresponding European Patent Application No. EP 21180819.1 dated Oct. 27, 2021 (7 pages).

(Continued)

*Primary Examiner* — Drew A Dunn
*Assistant Examiner* — Pamela J Jeppson
(74) *Attorney, Agent, or Firm* — Osha Bergman Watanabe & Burton LLP

(57) ABSTRACT

A charging controller includes a current measurement unit configured to measure a charging current of a rechargeable battery, a detection unit configured to detect switching from a constant current charge to a constant voltage charge based on the charging current measured by the current measurement unit, during charge of the rechargeable battery, and an update unit configured to update a full charge capacity of the rechargeable battery based on a charged capacity after the point in time, detected by the detection unit, of switching from the constant current charge to the constant voltage charge.

7 Claims, 18 Drawing Sheets

(56) References Cited

U.S. PATENT DOCUMENTS

2019/0094305 A1* 3/2019 Takechi ............... G01R 31/367
2021/0336545 A1* 10/2021 Chiu .................... H02J 7/00711

FOREIGN PATENT DOCUMENTS

| | | |
|---|---|---|
| JP | 2002-247702 A | 8/2002 |
| JP | 2003-224901 A | 8/2003 |
| JP | 2006-153663 A | 6/2006 |
| JP | 2008-278624 A | 11/2008 |
| JP | 2011-043460 A | 3/2011 |
| JP | 2014-045626 A | 3/2014 |
| JP | 2015-059816 A | 3/2015 |
| WO | 2011/122310 A1 | 10/2011 |
| WO | 2014111784 A1 | 7/2014 |
| WO | 2015/115044 A1 | 8/2015 |

OTHER PUBLICATIONS

Combined Search and Examination Report issued in corresponding Patent Application No. GB2108878.6 dated Feb. 4, 2022 (9 pages).

* cited by examiner

CHARGING CONTROLLER, RECHARGEABLE BATTERY, ELECTRONIC DEVICE, AND CONTROL METHOD

FIELD OF THE INVENTION

The present invention relates to a charging controller, a rechargeable battery, an electronic device, and a control method.

BACKGROUND OF THE INVENTION

When a rechargeable battery is repeatedly used, a state of the rechargeable battery gradually changes and deteriorates. For example, as a full charge capacity of the rechargeable battery decreases due to such deterioration over time, an error may be caused in a calculation of a remaining capacity. It is therefore necessary to detect a change in full charge capacity of the rechargeable battery corresponding to the deterioration over time to update a value of the full charge capacity.

A method of detecting a full charge capacity of the rechargeable battery changing corresponding to deterioration over time includes, for example, a method in which the battery is fully discharged once and then charged until a fully charged state is reached, and the full charge capacity is obtained by integrating the charged capacity during charge (for example, Japanese Unexamined Patent Application Publication No. 2003-224901).

However, if it is necessary to fully discharge the rechargeable battery once when detecting the full charge capacity of the rechargeable battery as mentioned above, the full charge capacity was less frequently updated even if changed because it is less likely to be used until the fully discharged state in practical use.

SUMMARY OF THE INVENTION

One or more embodiments of the present invention provide a charging controller, a rechargeable battery, an electronic device, and a control method, capable of appropriately updating a full charge capacity of a rechargeable battery in practical use.

A charging controller according to the first aspect of the present invention includes a current measurement unit configured to measure a charging current of a rechargeable battery, a detection unit configured to detect switching from a constant current charge to a constant voltage charge based on the charging current measured by the current measurement unit, during charge of the rechargeable battery, and an update unit configured to update a full charge capacity of the rechargeable battery based on a charged capacity after the point in time, detected by the detection unit, of switching from the constant current charge to the constant voltage charge.

In the above-described charging controller, a charging rate (a ratio of the charged capacity to the full charge capacity) at the point in time of switching from the constant current charge to the constant voltage charge during charge may be preset, and the update unit may update the full charge capacity of the rechargeable battery based on the charged capacity from the point in time detected by the detection unit until the fully charged state is reached and the preset charging rate.

In the above-described charging controller, the current measurement unit may measure the charging current of the rechargeable battery at a predetermined period, and the detection unit may detect switching from the constant current charge to the constant voltage charge when a measurement value of the charging current measured by the current measurement unit at every predetermined period has continuously decreased from a previous measurement value by greater than or equal to a certain value for a predetermined number of times.

The above-described charging controller may further comprise an internal resistance measurement unit configured to measure an internal resistance of the rechargeable battery multiple times over a charging period of the rechargeable battery, and the detection unit may detect a peak of the internal resistance based on a change in the internal resistance measured by the internal resistance measurement unit and detect the point of switching from the constant current charge to the constant voltage charge while referring to the detected peak of the internal resistance.

The above-described charging controller may further comprise a voltage measurement unit configured to measure a voltage of the rechargeable battery, and the internal resistance measurement unit may raise a measurement frequency of the internal resistance when the voltage measured by the voltage measurement unit during the charging period of the rechargeable battery has reached a predetermined threshold value.

In the above-described charging controller, the internal resistance measurement unit may lower the measurement frequency in response to the detection of the peak of the internal resistance by the detection unit.

In the above-described charging controller, the detection unit may detect as a peak when an amount of change in a value of the internal resistance measured by the internal resistance measurement unit over multiple times has become less than or equal to a predetermined threshold value.

In the above-described charging controller, the internal resistance measurement unit may calculate, by temporarily stopping the charging current during the charging period of the rechargeable battery, the internal resistance of the rechargeable battery based on a difference between a voltage of the rechargeable battery before the stoppage and that of the rechargeable battery during the stoppage.

In addition, a control method in a charging controller according to the fifth aspect of the present invention has steps of a current measurement unit measuring a charging current of a rechargeable battery, a detection unit detecting switching from a constant current charge to a constant voltage charge based on the charging current measured by the current measurement unit, during charge of the rechargeable battery, and an update unit updating a full charge capacity of the rechargeable battery based on a charged capacity after the point in time, detected by the detection unit, of switching from the constant current charge to the constant voltage charge.

In addition, a control method in a charging controller according to the sixth aspect of the present invention has steps of an internal resistance measurement unit measuring an internal resistance of a rechargeable battery multiple times over a charging period of the rechargeable battery, a detection unit detecting a peak of the internal resistance based on a change in the internal resistance measured by the internal resistance measurement unit, and an update unit updating a full charge capacity of the rechargeable battery referring to the peak of the internal resistance detected by the detection unit.

According to the above-described aspects of the present invention, it is possible to appropriately update the full

DETAILED DESCRIPTION OF THE INVENTION

Hereinafter, the embodiments of the present invention are described in detail with reference to the drawings.

First Embodiment

An outline of an information processing device according to the first embodiment of the present invention is first described.

Figure 1:
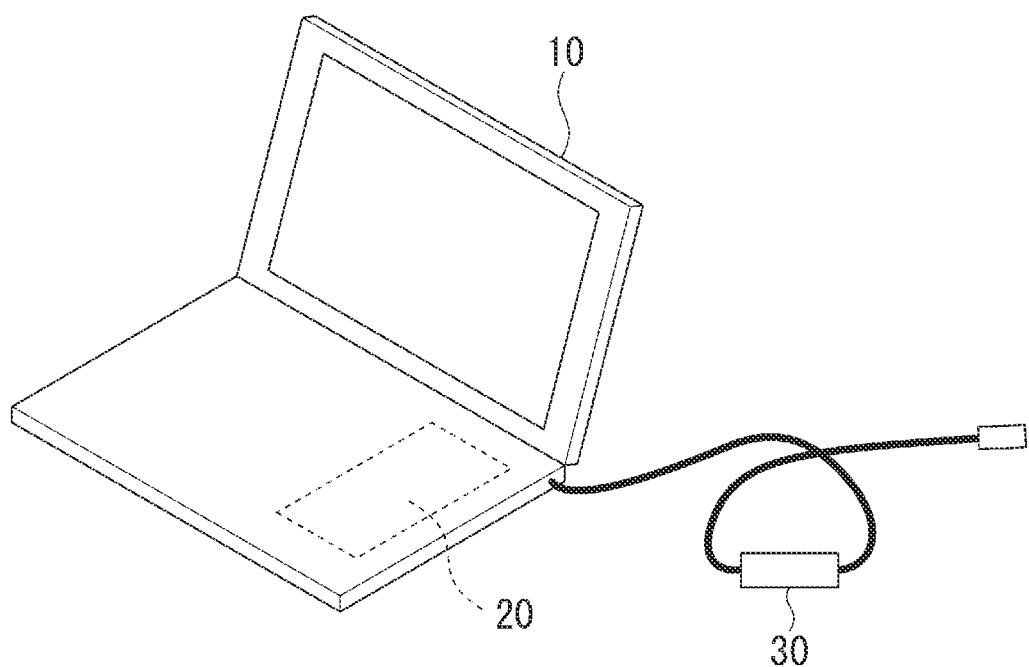
FIG. 1 is an external view of an electronic device according to a first embodiment.

FIG. 1 is an external view of an electronic device internally having a rechargeable battery according to the present embodiment. An electronic device 10 as illustrated is a clamshell (laptop) PC (personal computer).

It is to be noted that the electronic device 10 may be a tablet PC or smartphone etc.

A battery 20 is a rechargeable battery for supplying electrical power to the electronic device 10, and can be repeatedly used by being charged from an AC adapter 30. For example, a lithium-ion battery can be exemplified as the battery 20. When the electronic device 10 is operated with electrical power that is supplied from the battery 20, an operable time depends on a remaining capacity of the battery 20. The remaining capacity of the battery 20 can be calculated by "Full charge capacity (FCC)" minus "Discharged capacity." In this regard, as the battery 20 is repeatedly used, its state gradually changes and deteriorates. As the full charge capacity of the battery decreases due to deterioration over time, an error may be caused in a calculation of the remaining capacity.

Figure 2:
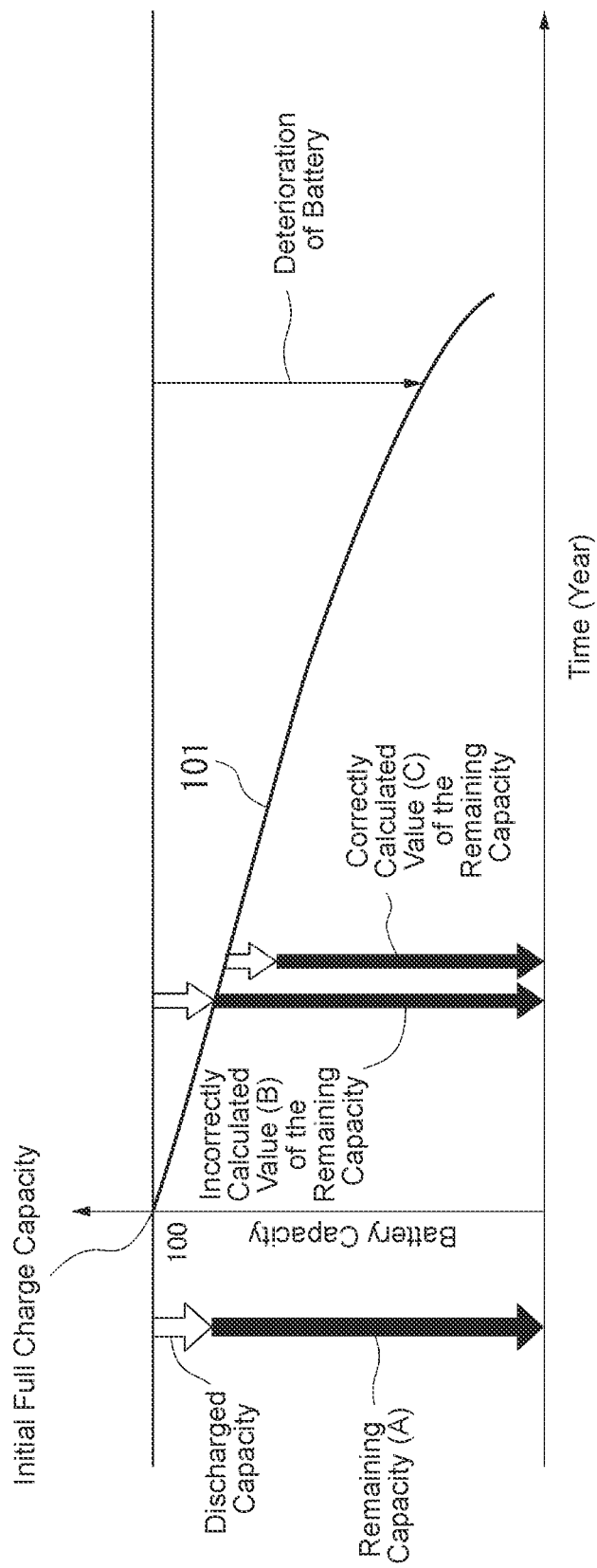
FIG. 2 is a schematic view describing influence of battery deterioration over time on a battery capacity.

FIG. 2 is a schematic view describing influence of deterioration over time of the battery 20 on a battery capacity. In this drawing, a vertical axis represents a battery capacity, and a horizontal axis represents a lapse of time. When an initial full charge capacity is "100," a capacity obtained by subtracting a discharged capacity from the full charge capacity is a remaining capacity (A). A curve denoted by a symbol 101 represents a change in full charge capacity with the deterioration of the battery according to the lapse of time. When a remaining capacity is calculated by subtracting the discharged capacity from the initial full charge capacity "100," in spite of the decrease in full charge capacity due to the deterioration over time, an incorrectly calculated value (B) of the remaining capacity is obtained. By subtracting the discharged capacity from a full charge capacity decreased due to the deterioration over time to calculate a remaining capacity, a correctly calculated value (C) of the remaining capacity can be obtained. Thus, when the full charge capacity is not appropriately updated in practical use corresponding to deterioration over time, the accuracy of the remaining capacity to be displayed on the electronic device 10 is reduced.

For example, when the full charge capacity is not updated unless the battery is charged from a complete discharge state fully discharged until a fully charged state as before, a full charge capacity value was less frequently updated since there were few chances to get into the complete discharge state in practical use. Then, in the present embodiment, the full charge capacity of the battery 20 is updated based on a charged capacity during a partial specific charging period among a charging period without bringing the battery into the complete discharge state so that the full charge capacity value is appropriately updated even in practical use.

Figure 3:
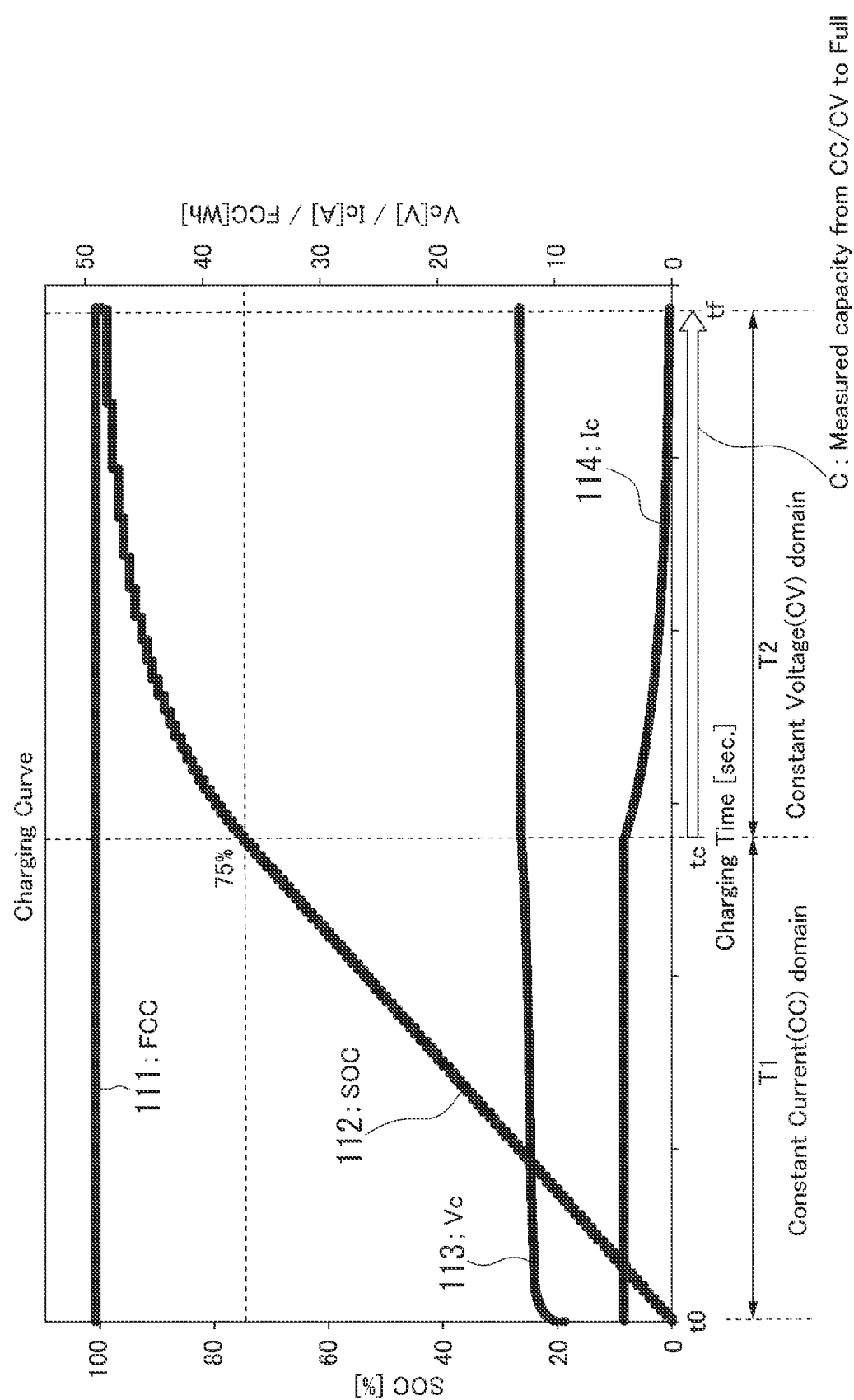
FIG. 3 is a graph illustrating charge characteristics of a battery according to the first embodiment.

Next, a method of calculating a full charge capacity according to the present embodiment is described in detail, with reference to FIG. 3. FIG. 3 is a graph illustrating charge characteristics of the battery 20 according to the present embodiment. In this drawing, a horizontal axis represents a charging time, a curve denoted by a symbol 111 represents a full charge capacity (FCC [wh]), a curve denoted by a symbol 112 represents a charging rate (SOC: State of Charge [%]), a curve denoted by a symbol 113 represents a battery voltage (Vc [V]), and a curve denoted by a symbol 114 represents a charging current (Ic [A]).

A maximum voltage and a maximum current in charging the battery 20 are set to the electronic device 10, charge is done by a Constant Current (CC) charge until the battery voltage reaches the maximum voltage, and shifts to a Constant Voltage (CV) charge after it reaches the maximum voltage. In an illustrated example, a time t0 represents a charge start point in time, and a time tc represents a point in time of switching from the constant current charge to the constant voltage charge. In addition, a time tf represents a point in time determined to be a fully charged state. That is, time period T1 from the time t0 to the time tc is a constant current domain and time period T2 from the time tc to the time tf is a constant voltage domain.

Because a charging rate at the point in time of switching from the constant current charge to the constant voltage charge is a fixed value, the full charge capacity can be calculated by measuring a charged capacity during the time period T2 from this point in time until the fully charged state is reached and converting the measured charged capacity into a charging rate (percentage). In this case, an example in which a charging rate at the point in time (time tc) of switching from the constant current charge to the constant voltage charge is 75% is illustrated. In this example, when a measurement result of the charged capacity during the time period T2 from the time tc to the time tf (i.e., the charging rate of 75% to 100%) is C, the full charge capacity (FCC) can be calculated by the following Formula 1.

$$FCC = C \times (100/25) \quad \text{(Formula 1)}$$

It is to be noted that although the charging rate at the point in time of switching from the constant current charge to the constant voltage charge to be used can be the same value (for example, 75%) for the same battery, it may be different for different types of batteries due to a difference in material etc. Then, the charging rate at the point in time of switching to the constant voltage charge is preset according to a battery type etc.

(Configuration of the Battery 20)

Hereinafter, a specific configuration of the battery 20 is described.

Figure 4:
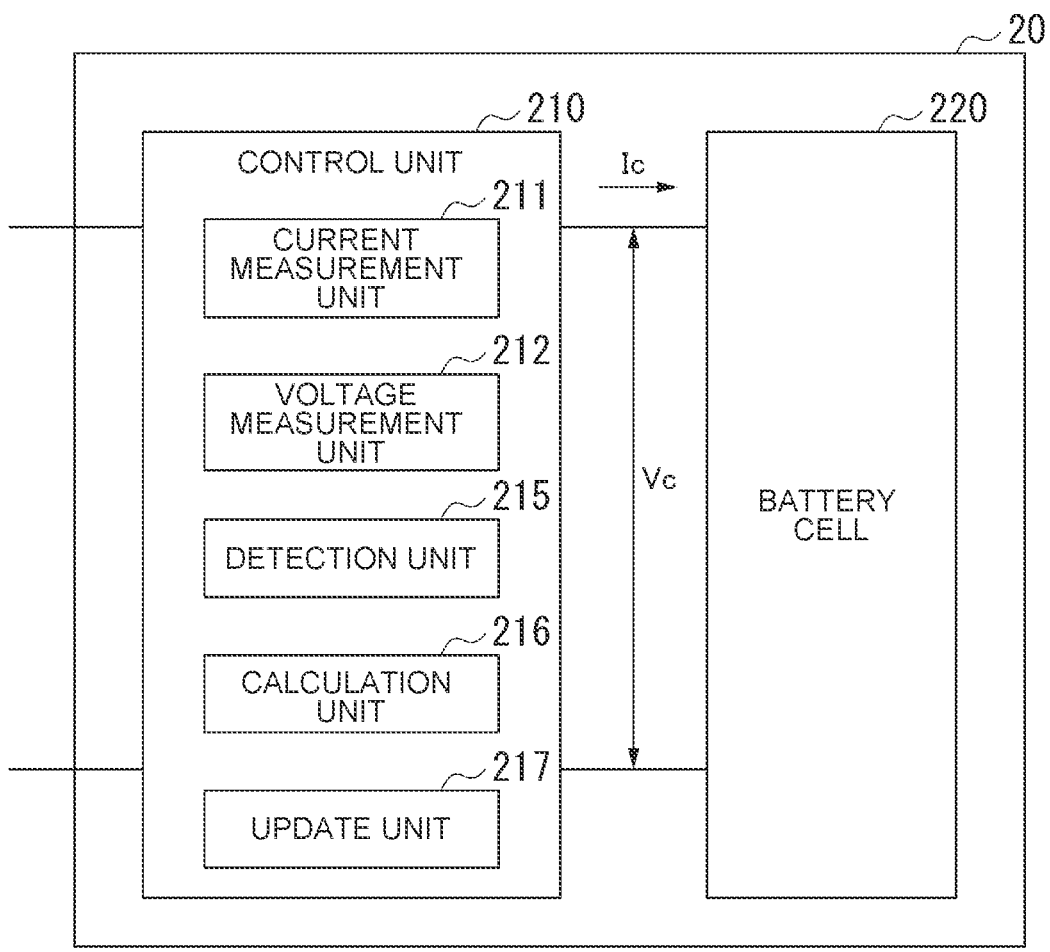
FIG. 4 is a block diagram illustrating one example of a configuration of the battery according to the first embodiment.

FIG. 4 is a block diagram illustrating one example of a configuration of the battery 20 according to the present embodiment. The battery 20 includes a control unit 210 and a battery cell 220. The control unit 210 includes a MPU (Micro Processing Unit) etc. The control unit 210 includes, as functional components for processing to be performed by the MPU, a current measurement unit 211, a voltage measurement unit 212, a detection unit 215, a calculation unit 216, and an update unit 217.

The current measurement unit 211 measures a charging current (Ic) and a discharging current (−Ic) of the battery 20. The voltage measurement unit 212 measures a battery voltage (Vc) of the battery 20. The detection unit 215 detects a point of switching from the constant current charge to the constant voltage charge based on a charging current measured by the current measurement unit 211 during charge of the battery 20. For example, the current measurement unit 211 measures the charging current of the battery 20 at a predetermined period. Then, the detection unit 215 detects the point of switching from the constant current charge to the constant voltage charge based on a change in measurement value of the charging current measured by the current measurement unit 211 at every predetermined period. For example, when the measurement value of the charging current measured by the current measurement unit 211 at every predetermined period has continuously decreased from a previous measurement value by greater than or equal to a certain value for a predetermined number of times, the detection unit 215 detects switching from the constant current charge to the constant voltage charge. It is to be noted that the detection unit 215 may detect an internal temperature of the battery 20 using a thermistor (not illustrated) provided inside the battery 20. Hereinafter, a specific example of a process of detecting the point of switching from the constant current charge to the constant voltage charge is described with reference to FIG. 5 and FIG. 6.

Figure 5:
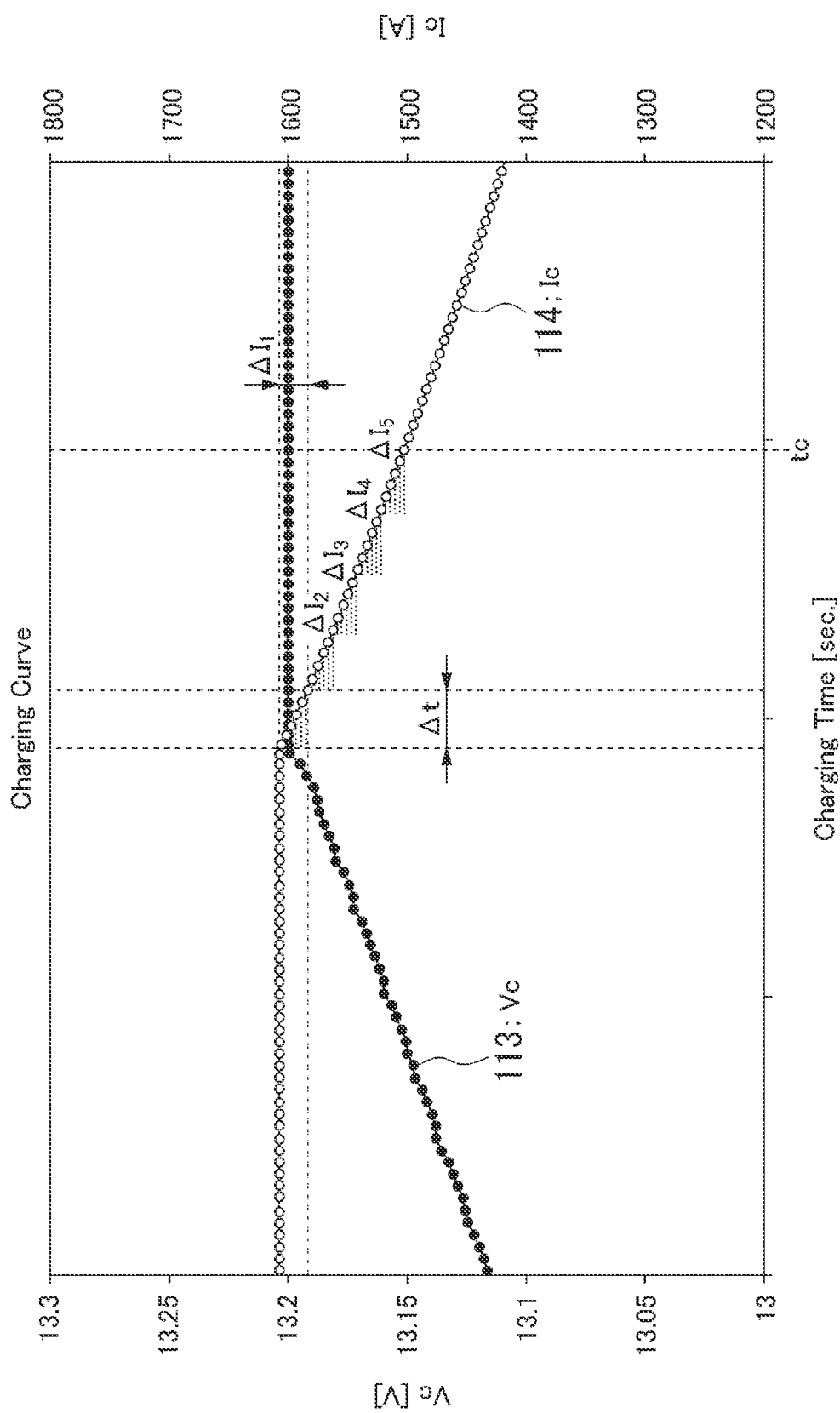
FIG. 5 is a graph enlarging a part switching from a constant current charge to a constant voltage charge in FIG. 3.

FIG. 5 is a graph enlarging a part switching from the constant current charge to the constant voltage charge in the drawing of the charge characteristics as illustrated in FIG. 3. In this drawing, a horizontal axis represents a charging time, a curve denoted by a symbol 113 represents a battery voltage Vc [V], and a curve denoted by a symbol 114 represents a charging current Ic [A]. In an illustrated example, the current measurement unit 211 measures the charging current at an interval of a predetermined time Δt (for example, 10 seconds) (a predetermined period). The detection unit 215 determines whether or not an amount of change ΔI between the charging current Ic and the charging current Ic after the Δt, measured by the current measurement unit 211, is a decrease of greater than or equal to a certain value, and when the ΔI is a continuous decrease of greater than or equal to a certain value for a predetermined number of times (for example, 5 times) (when $\Delta I_1$, $\Delta I_2$, $\Delta I_3$, $\Delta I_4$, and $\Delta I_5$ illustrated are all a decrease of greater than or equal to a certain value), the detection unit 215 determines switching from the constant current charge to the constant voltage charge and detects switching from the constant current charge to the constant voltage charge. The detection unit 215 sets a time tc at the point in time when it has detected switching from the constant current charge to the constant voltage charge. It is to be noted that in the illustrated example, although the detection unit 215 detects switching from the constant current charge to the constant voltage charge when the ΔI is a continuous decrease of greater than or equal to a certain value for five times, the number of times is not limited to five times but can be set to an arbitrary number of times.

Figure 6:
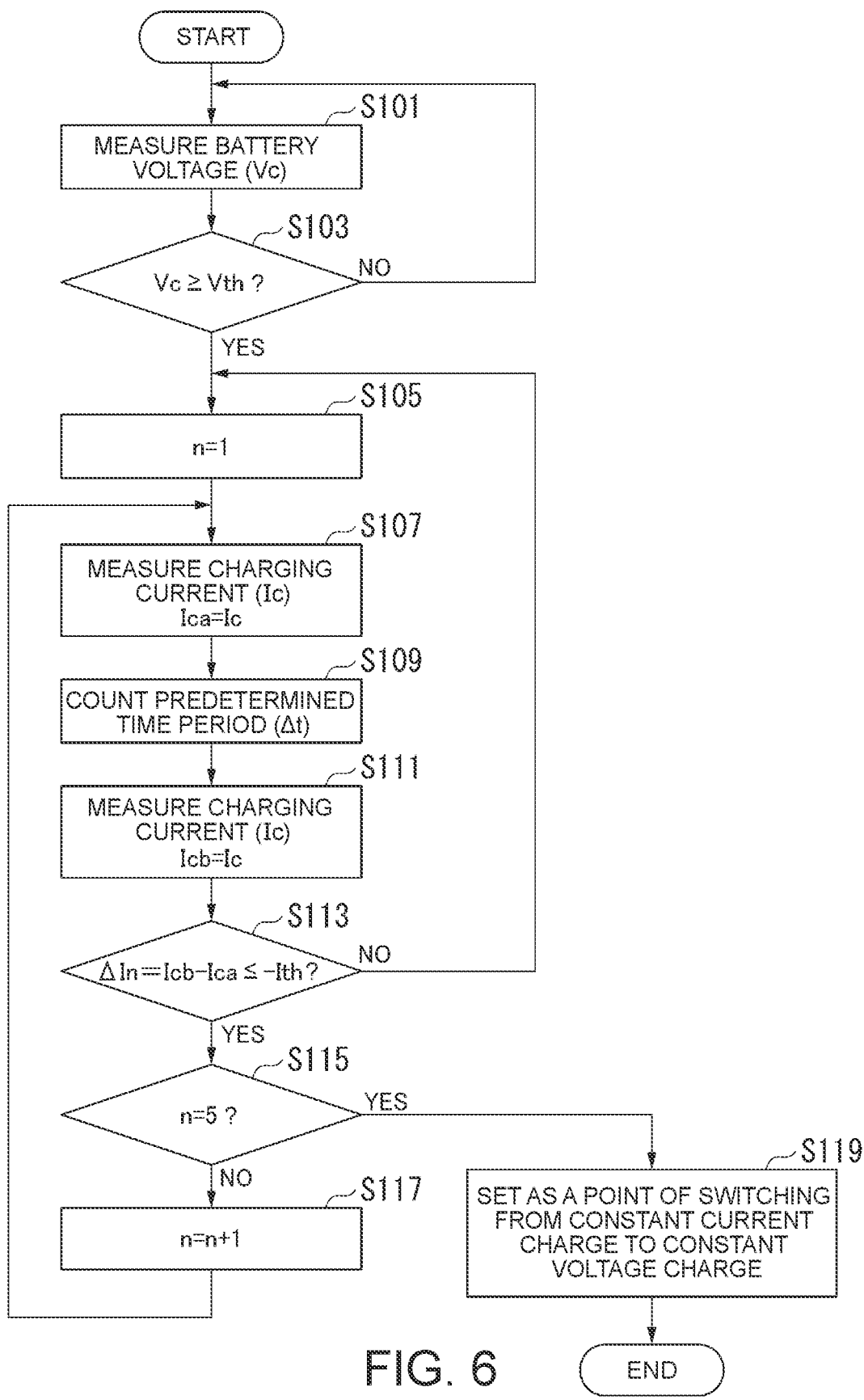
FIG. 6 is a flow chart illustrating one example of a charging mode switching detection process according to the first embodiment.

FIG. 6 is a flow chart illustrating one example of a charging mode switching detection process of detecting a point of switching from the constant current charge to the constant voltage charge according to the present embodiment. Referring to this FIG. 6, an operation of a charging mode switching detection process to be carried out by the control unit 210 of the battery 20 is described. This charging mode switching detection process is started in response to a start of charge of the battery 20.

(Step S101) The control unit 210 measures the battery voltage (Vc), and proceeds to a process in step S103.

(Step S103) The control unit 210 determines whether or not the battery voltage (Vc) measured in step S101 is greater than or equal to a voltage threshold value (Vth). This voltage threshold value (Vth) is to determine a point in time of starting a process of measuring a change in charging current at a predetermined period and is preset to a voltage that is decreased by a certain voltage from a maximum voltage when the battery 20 is charged. In the example of the charge characteristics as illustrated in FIG. 5, the voltage threshold value (Vth) is set to 13.068 [V], as an example. When the control unit 210 determines that the battery voltage (Vc) is less than the voltage threshold value (Vth) (NO), it returns to the process in step S101. On the other hand, when the control unit 210 determines that the battery voltage (Vc) is greater than or equal to the voltage threshold value (Vth) (YES), it proceeds to a process in step S105.

(Step S105) The control unit 210 starts a first process of detecting a change in charging current as n=1, and proceeds to a process in step S107.

(Step S107) The control unit 210 measures the charging current (Ic) and assigns a value of the measured charging current (Ic) to Ica. Then, it proceeds to a process in step S109.

(Step S109) The control unit 210 counts a predetermined time period ($\Delta t$), and after the predetermined time period ($\Delta t$) elapses, it proceeds to a process in step S111. For example, the predetermined time period ($\Delta t$) is 10 seconds.

(Step S111) The control unit 210 measures the charging current (Ic) and assigns a value of the measured charging current (Ic) to Icb. Then, it proceeds to a process in step S113.

(Step S113) The control unit 210 determines whether or not an amount of change $\Delta In$ (for example, n=1) between the value Ica of the charging current measured in step S107 and the value Icb of the charging current measured in step S111 is a decrease of greater than or equal to a preset threshold value (Ith). For example, the control unit 210 calculates $\Delta I_1 = Icb - Ica$ in the first (n=1) detection of the change in charging current and determines whether or not $\Delta I_1 \leq -Ith$. As an example, the threshold value (Ith) is 20 mA. When the control unit 210 determines that the calculated amount of change $\Delta I_1$ in charging current is a decrease of less than the threshold value (Ith) ($\Delta I_1 > -Ith$) (NO), it returns to the process in step S105. On the other hand, when the control unit 210 determines that the calculated amount of change $\Delta I_1$ in charging current is a decrease of greater than or equal to the threshold value (Ith) ($\Delta I_1 \leq -Ith$) (YES), it proceeds to a process in step S115.

(Step S115) The control unit 210 determines whether or not n=5, i.e., whether or not the amount of change $\Delta I_1$ in charging current has been a continuous decrease of greater than or equal to the threshold value (Ith) for 5 times. When the control unit 210 determines that n<5 (NO), it proceeds to a process in step S117. On the other hand, when the control unit 210 determines that n=5 (YES), it proceeds to a process in step S119.

(Step S117) When n<5, the control unit 210 increases n by 1 (for example, n=2), and returns to the process in step S107. Then, the control unit 210 starts a (n+1)th (for example, second) process of detecting the amount of change in charging current.

(Step S119) When n=5, the control unit 210 sets as a point of switching from the constant current charge to the constant voltage charge. For example, the control unit 210 detects switching from the constant current charge to the constant voltage charge and sets a point in time (time tc) of switching.

Returning to FIG. 4, the calculation unit 216 calculates the full charge capacity of the battery 20 based on a charged capacity after the point in time of switching, detected by the detection unit 215, from the constant current charge to the constant voltage charge. For example, a charging rate at the point in time of switching from the constant current charge to the constant voltage charge during charge is preset in the control unit 210 (for example, 75%). The calculation unit 216 determines by integration a charged capacity C from the point in time of switching from the constant current charge to the constant voltage charge until the fully charged state is reached (for example, the charging rate of 75% to 100%) (time period T2 in FIG. 3) based on the measurement result of the battery voltage and that of the charging current during the time period. Then, the calculation unit 216 calculates the full charge capacity (FCC) based on this charged capacity C from the charging rate of 75% to that of 100%, by the above-mentioned Formula 1.

For example, an initial value of the full charge capacity of the battery 20 is preset in the control unit 210. Then, the update unit 217 will appropriately update the initial value of the full charge capacity of the battery 20 to a current set value based on the result of calculation by the calculation unit 216. That is, the update unit 217 corrects the preset initial value of the full charge capacity by updating with the value of the full charge capacity calculated by the calculation unit 216 according to deterioration over time. It is to be noted that the update may be made, each time the calculation of the full charge capacity is made by the calculation unit 216, or only when the calculated value has decreased below the set value (or has decreased by greater than or equal to a certain value).

That is, the update unit 217 updates the full charge capacity of the battery 20 based on the charged capacity after the point in time, detected by the detection unit 215, of switching from the constant current charge to the constant voltage charge. Specifically, the update unit 217 updates the full charge capacity of the battery 20 based on the charged capacity from the point in time, detected by the detection unit 215, of switching from the constant current charge to the constant voltage charge, until the fully charged state is reached, and the charging rate (for example, 75%) at the point in time of switching from the constant current charge to the constant voltage charge.

It is to be noted that the fully charged state of the battery 20 is detected by the detection unit 215 based on the measurement value of the charging current measured by the current measurement unit 211 at every predetermined period or the change in the measurement value. For example, when the measurement value of the charging current has become less than or equal to a predetermined value or has continuously become less than or equal to a predetermined value for a predetermined number of times, the detection unit 215 may determine that the fully charged state has been reached. In addition, when a decrease amount of the measurement value of the charging current has become less than a predetermined value or has continuously become less than a predetermined value for a predetermined number of times, the detection unit 215 may determine that the fully charged state has been reached.

As described above, the battery 20 (one example of a rechargeable battery) according to the present embodiment includes the control unit 210 (one example of a charging controller). The control unit 210 measures the charging current during charge of the battery 20 and detects switching from the constant current charge to the constant voltage charge based on the measured charging current. Then, the control unit 210 updates the full charge capacity of the battery 20 based on the charged capacity after the detected point in time of switching from the constant current charge to the constant voltage charge.

Thus, the battery 20 can recognize and update the full charge capacity in a charge in a charging region that is frequently used also in practical use, by making use of the switching from the constant current charge to the constant voltage charge without being completely discharged. The battery 20 can therefore appropriately update the full charge capacity in practical use. In addition, the battery 20 or the electronic device 10 can always notify a user of a highly accurate remaining capacity even though the full charge capacity of the battery 20 changes due to deterioration over time etc.

For example, the charging rate at the point in time of switching from the constant current charge to the constant voltage charge during charge is preset. Then, the control unit 210 calculates and updates the full charge capacity of the battery 20 based on the charged capacity from the detected point in time of switching from the constant current charge to the constant voltage charge until the fully charged state is reached and the preset charging rate.

Thus, the battery 20 can recognize and update, in a time period during charge, the full charge capacity in a partial charge that is frequently used also in practical use, by making use of the charging rate at the point in time of switching from the constant current charge to the constant voltage charge being decided.

In addition, the control unit 210 measures the charging current of the battery 20 at a predetermined period, and detects switching the constant current charge to the constant voltage charge when the measurement value of the measured charging current at every predetermined period has continuously decreased from a previous measurement value by greater than or equal to a certain value (for example, threshold value (Ith)) for a predetermined number of times (for example, 5 times).

Thus, the battery 20 can accurately detect, in a time period during charge, the point in time of switching from the constant current charge to the constant voltage charge.

Second Embodiment

Next, the second embodiment of the present invention is described.

While the full charge capacity is calculated and updated making use of the point of switching from the constant current charge to the constant voltage charge during charge of the rechargeable battery in the first embodiment, it is calculated and updated making use of a change in internal resistance of the rechargeable battery, in the present embodiment.

Figure 7:
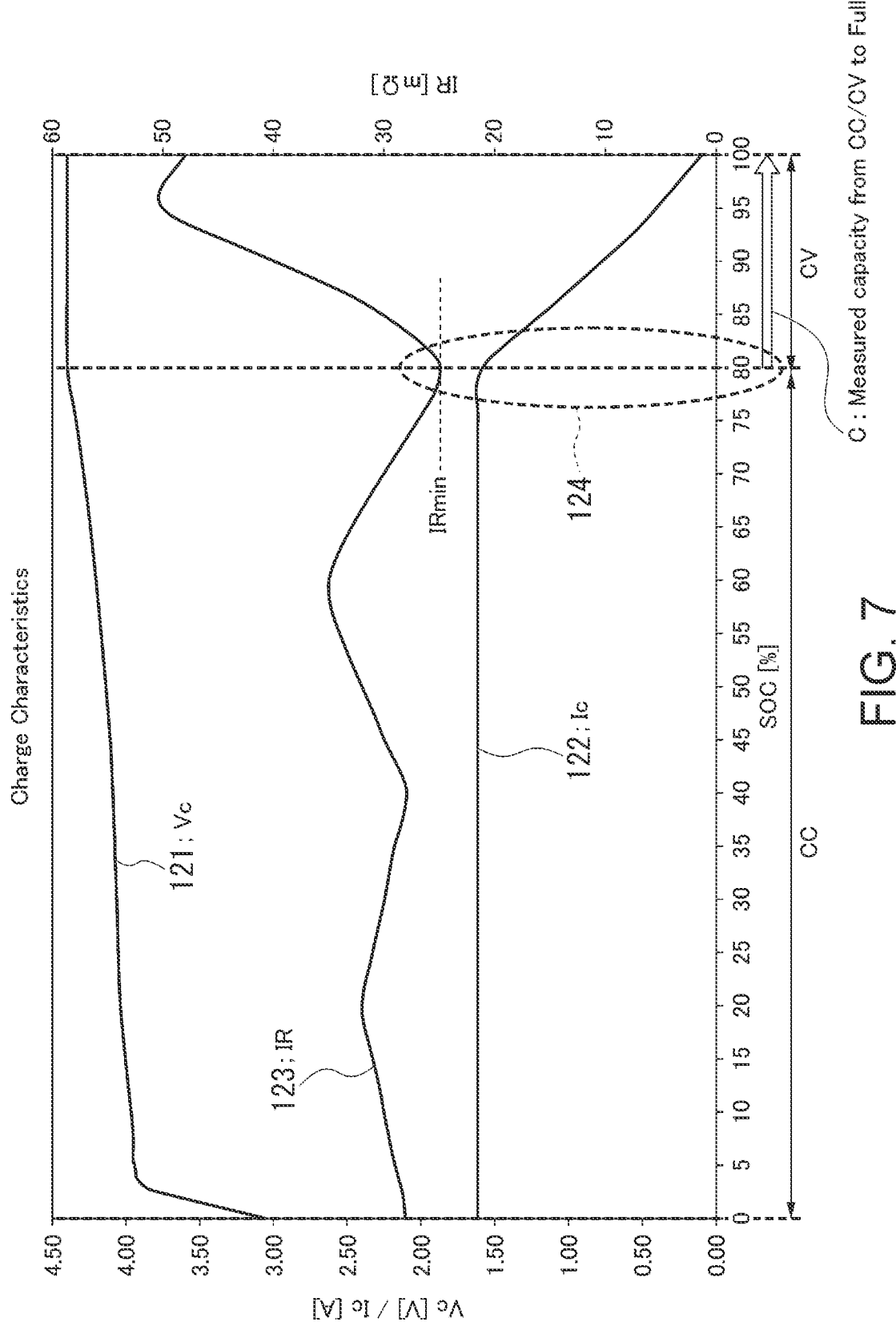
FIG. 7 is a graph illustrating a change in internal resistance in charge characteristics according to a second embodiment.

FIG. 7 is a graph illustrating a change in internal resistance in charge characteristics according to the present embodiment. In this drawing, a horizontal axis represents a charging rate (SOC [%]), a curve denoted by a symbol 121 represents a battery voltage (Vc), a curve denoted by a symbol 122 represents a charging current (Ic [A]), and a curve denoted by a symbol 123 represents an internal resistance (IR [mΩ]). As can be seen from a change in charging rate (SOC [%]) and that in internal resistance (IR [mΩ]), in a part as denoted by a symbol 124, a point at which the internal resistance becomes minimum corresponds to a point at which the charging rate becomes a fixed rate. In an illustrated example, the charging rate at this point at which the internal resistance becomes minimum is 80%.

That is, the full charge capacity can be calculated by detecting the point at which the internal resistance becomes minimum and then converting a charged capacity from the point in time at which the internal resistance becomes minimum until the fully charged state is reached, into a charging rate (percentage). In this case, an example in which the charging rate at the point in time at which the internal resistance becomes minimum is 80% is illustrated, and thus when a measurement result of the charged capacity from the point in time at which the charging rate is 80% until the charging rate reaches 100% is C, the full charge capacity (FCC) can be calculated by the following Formula 2.

$$FCC = C \times (100/20) \quad \text{(Formula 2)}$$

It is to be noted that although the charging rate at the point at which the internal resistance becomes minimum to be used can be the same value for the same battery, as described in the first embodiment, it may be different for different types of batteries due to a difference in material etc. and thus it is preset according to the battery type etc.

Figure 8:
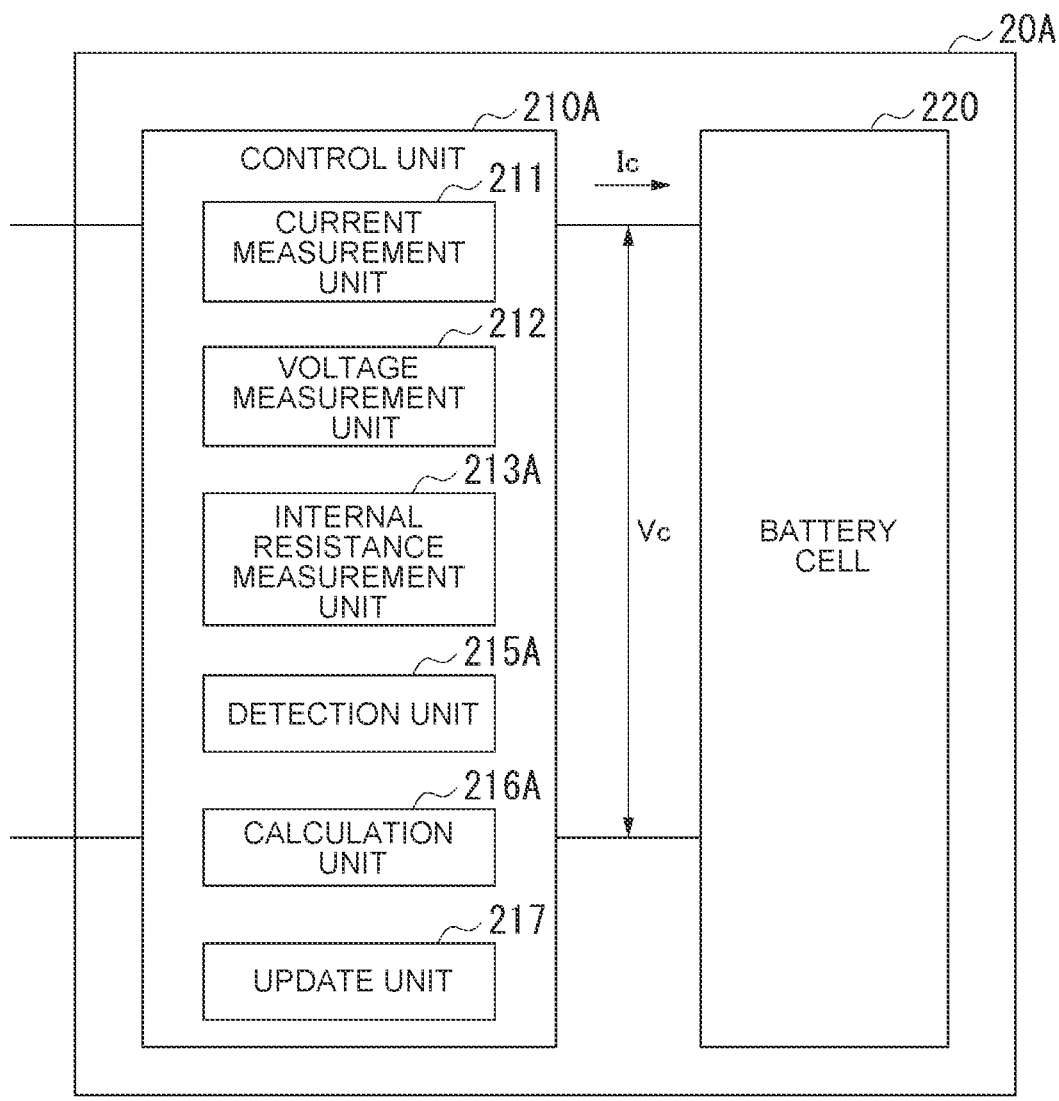
FIG. 8 is a block diagram illustrating a configuration example of a battery according to the second embodiment.

FIG. 8 is a block diagram illustrating a configuration example of a battery 20A as one example of a rechargeable battery according to the present embodiment. The battery 20A includes a control unit 210A and a battery cell 220. The control unit 210A includes a current measurement unit 211, a voltage measurement unit 212, an internal resistance measurement unit 213A, a detection unit 215A, a calculation unit 216A, and an update unit 217. It is to be noted that in this drawing, parts corresponding to those in FIG. 4 are denoted by the same symbols, and a description thereof is omitted.

The internal resistance measurement unit 213A measures an internal resistance of the battery 20A based on a charging current measured by the current measurement unit 211 and a battery voltage measured by the voltage measurement unit 212 etc.

The detection unit 215A detects a change in internal resistance based on the measurement values of the internal resistance measured by the internal resistance measurement unit 213A during charge. For example, the detection unit 215A detects a peak of the internal resistance during charge. For example, the detection unit 215A detects a point at which the internal resistance becomes minimum during charge. Hereinafter, a specific example of a process of detecting a point at which the internal resistance of the battery 20A becomes minimum is described with reference to FIG. 9 and FIG. 10.

Figure 9:
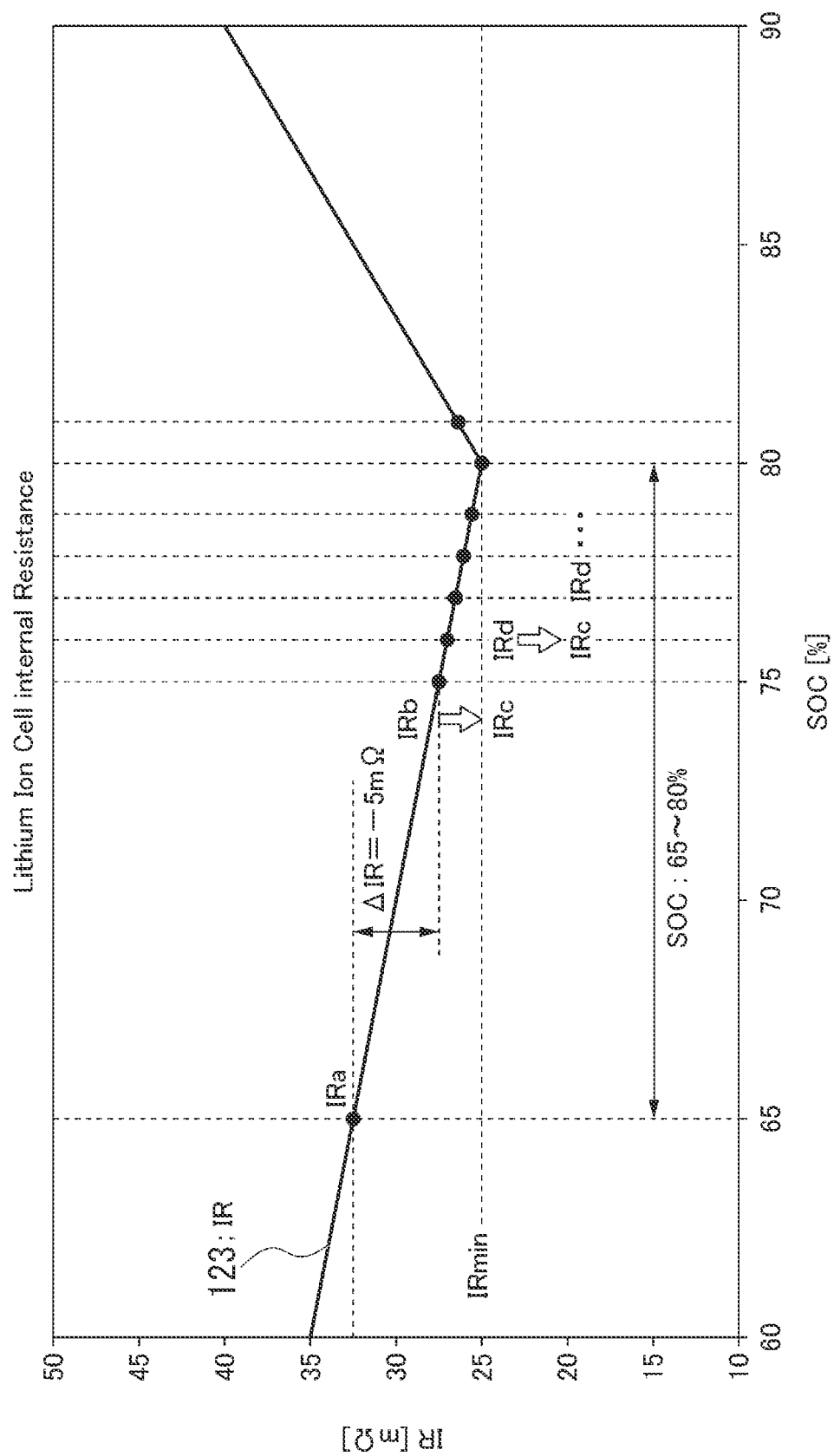
FIG. 9 is a graph enlarging a section including a point at which the internal resistance in FIG. 7 becomes minimum.

FIG. 9 is a graph enlarging a part including a point at which the internal resistance in the drawing of the charge characteristics as illustrated in FIG. 7 becomes minimum. A curve denoted by a symbol 123 represents an internal resistance (IR [mΩ]). When the charging rate (SOC) becomes greater than or equal to 65%, the internal resistance measurement unit 213A starts measurement of the internal resistance and measures at a predetermined period multiple times. When the internal resistance measurement unit 213A measures a value decreased from a measurement value (IRa) of the internal resistance at the point in time at which the charging rate (SOC) is 65% by greater than or equal to a certain value (for example, 5 mΩ), it shifts to measurement at shorter intervals after that point in time (in this case, the point in time at which the charging rate (SOC) is 75%). For example, the internal resistance measurement unit 213A measures the internal resistance every time the charging rate (SOC) increases by 1%. Based on the measurement values (IRc, IRd) of the internal resistance as thus measured, the detection unit 215A calculates an amount of change in internal resistance every time the charging rate (SOC) increases by 1% to detect a point at which the internal resistance becomes minimum.

Figure 10:
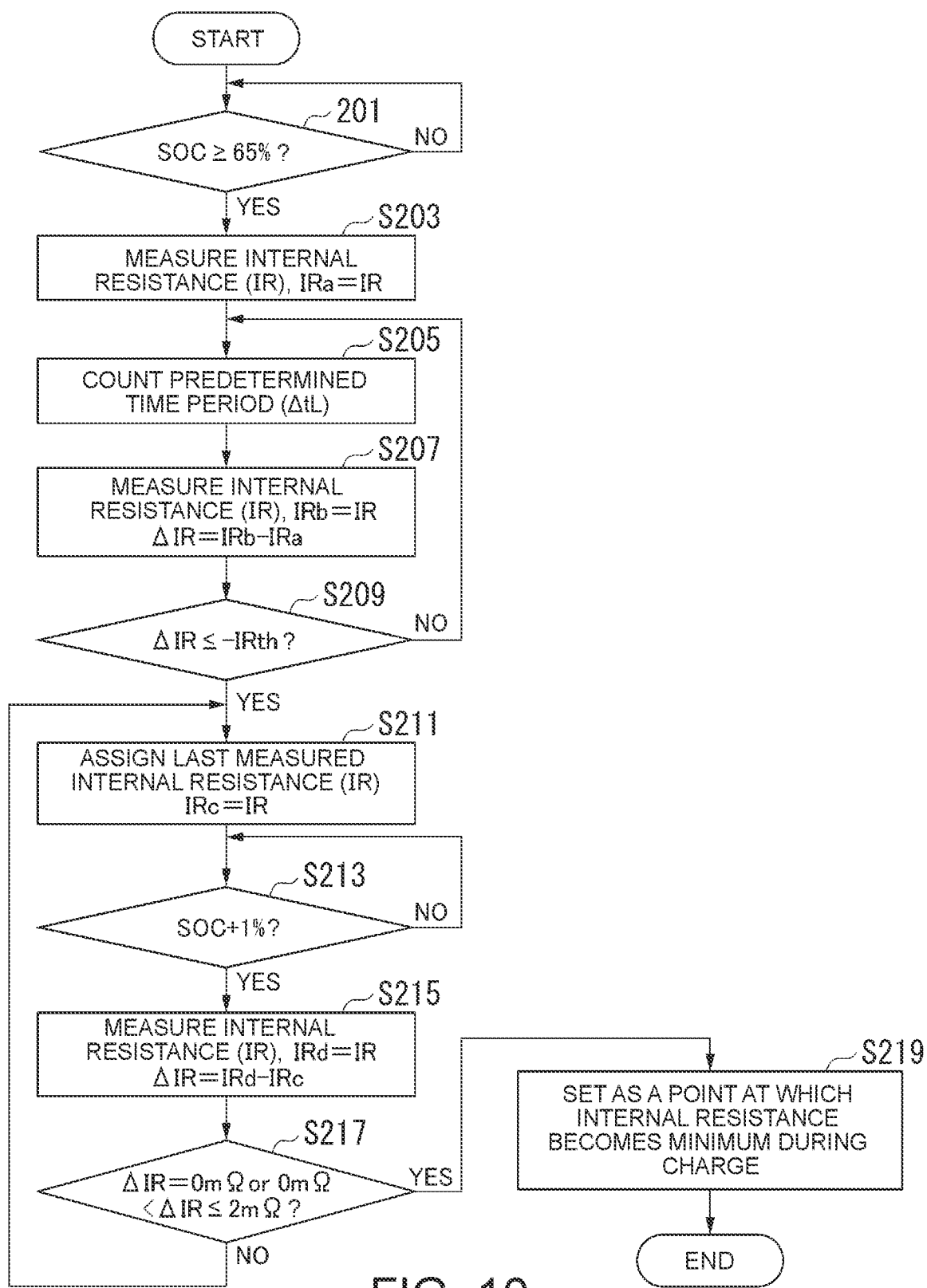
FIG. 10 is a flow chart illustrating an example of an internal resistance peak detection process according to the second embodiment.

FIG. 10 is a flow chart illustrating one example of an internal resistance peak detection process of detecting a point (peak) at which the internal resistance of the battery 20A becomes minimum, according to the present embodiment. Referring to this FIG. 10, an operation of the internal resistance peak detection process to be carried out by the control unit 210A of the battery 20A is described. This internal resistance peak detection process is started in response to a start of charge of the battery 20A.

(Step S201) The control unit 210A determines whether or not the charging rate (SOC) has become greater than or equal to 65%. It is to be noted that because the battery voltage (Vc) is 4.2 V at the point at which the charging rate (SOC) becomes 65% in the graph of the charge characteristics as illustrated in FIG. 7, the control unit 210A may determine whether or not the charging rate (SOC) has become greater than or equal to 65%, depending on whether or not the battery voltage has reached 4.2 V. When the control unit 210A determines that the charging rate (SOC) is less than 65% (the battery voltage has not reached 4.2 V) (NO), it repeats the process in step S201. On the other hand, when the control unit 210A determines that the charging rate (SOC) has become greater than or equal to 65% (the battery voltage has reached 4.2 V) (YES), it proceeds to a process in step S203.

(Step S203) The control unit 210A measures the internal resistance (IR) and assigns the measurement value to IRa. Then, it proceeds to a process in step S205.

(Step S205) The control unit 210A counts a predetermined time period ($\Delta tL$), and after the predetermined time period ($\Delta tL$) elapses, it proceeds to a process in step S207. It is to be noted that the control unit 210A may proceed to the process in step S207 upon an increase in the charging rate (SOC) of, for example, 5%, instead of the elapse of the predetermined time period ($\Delta tL$).

(Step S207) The control unit 210A measures the internal resistance (IR) and assigns the measurement value to IRb. Then, the control unit 210A calculates an amount of change in the internal resistance $\Delta IR$ ($\Delta IR=IRb-IRa$) and proceeds to a process in step S209.

(Step S209) The control unit 210A determines whether or not the amount of change in the internal resistance $\Delta IR$ has decreased by greater than or equal to a certain value IRth (for example, 5 m$\Omega$). When the control unit 210A determines that the amount of change in the internal resistance $\Delta IR$ has not decreased by greater than or equal to the certain value IRth (NO), it returns to the process in step S205. On the other hand, when the control unit 210A determines that the amount of change in the internal resistance $\Delta IR$ has decreased by greater than or equal to the certain value IRth (YES), it proceeds to a process in step S211.

(Step S211) The control unit 210A assigns a last measured internal resistance (IR) to IRc and proceeds to a process in step S213. The last measured internal resistance (IR) means IRb when it is determined that the amount of change in the internal resistance $\Delta IR$ has decreased by greater than or equal to the certain value IRth. In subsequent processes, the control unit 210A measures the internal resistance every time the charging rate (SOC) increases by 1%, and detects the amount of change in the internal resistance $\Delta IR$.

(Step S213) The control unit 210A determines whether or not the charging rate (SOC) has increased by 1%. While the charging rate (SOC) has not increased by 1% (NO), the control unit 210A waits, and when the control unit 210A determines that the charging rate (SOC) has increased by 1% (YES), it proceeds to a process in step S215. It is to be noted that the above 1% is an example and the charging rate (SOC) is not limited thereto.

(Step S215) The control unit 210A measures the internal resistance (IR) and assigns the measurement value to IRd. Then, the control unit 210A calculates an amount of change in the internal resistance $\Delta IR$ ($\Delta IR=IRd-IRc$) and proceeds to a process in step S217.

(Step S217) The control unit 210A determines whether or not it is a point at which the internal resistance becomes minimum, based on the amount of change in the internal resistance $\Delta IR$ calculated in step S215. For example, when the amount of change in the internal resistance $\Delta IR$ is greater than or equal to 0 m$\Omega$ and less than or equal to 2 m$\Omega$ ($\Delta IR=0$ m$\Omega$ or 0 m$\Omega<\Delta IR\leq 2$ m$\Omega$), the control unit 210A determines that it is the point at which the internal resistance becomes minimum. When the control unit 210A determines that it is not the point at which the internal resistance becomes minimum (NO), it returns to the process in step S211 and assigns the value IRd of the last measured internal resistance to IRc. Then, the control unit 210A measures again the internal resistance (IR) after an increase in the charging rate (SOC) of 1% and determines whether or not it is the point at which the internal resistance becomes minimum. On the other hand, when the control unit 210A determines that it is the point at which the internal resistance becomes minimum (YES), it proceeds to a process in step S219.

(Step S219) The control unit 210A sets as the point at which the internal resistance becomes minimum during charge. That is, the control unit 210A sets as a start point of integration of the charged capacity.

Returning to FIG. 8, the calculation unit 216A calculates the full charge capacity of the battery 20A based on the charged capacity from the point in time at which the internal resistance becomes minimum until the fully charged state is reached, based on the point at which the internal resistance becomes minimum, detected by the detection unit 215A during charge. For example, the charging rate (for example, the charging rate of 80%) at the point in time at which the internal resistance becomes minimum during charge is preset in the control unit 210A. The calculation unit 216A determines by integration a charged capacity C from the point in time at which the internal resistance becomes minimum during charge until the fully charged state is reached (for example, the charging rate of 80% to 100%) based on the measurement result of the battery voltage and that of the charging current during the time period. Then, the calculation unit 216A calculates the full charge capacity (FCC) based on this charged capacity C from the charging rate of 80% to that of 100%, by the above-mentioned Formula 2.

The update unit 217 will appropriately update the initial value of the full charge capacity of the battery 20A to a current set value based on the result of calculation by the calculation unit 216A. That is, the update unit 217 corrects the preset initial value of the full charge capacity by updating with the value of the full charge capacity calculated by the calculation unit 216A according to deterioration over time. It is to be noted that the update may be made, each time the calculation of the full charge capacity is made by the calculation unit 216A, or only when the calculated value has decreased below the set value (or has decreased by greater than or equal to a certain value).

That is, the update unit 217 in the present embodiment updates the full charge capacity of the battery 20A, based on the charged capacity after the point in time that is specified based on the change in the internal resistance measured by the internal resistance measurement unit 213A during charge. Specifically, the update unit 217 updates the full charge capacity of the battery 20A based on the charged capacity from the point in time at which the internal resistance measured by the internal resistance measurement unit 213A during charge becomes minimum until the fully charged state is reached, and the preset charging rate (for example, the charging rate of 80%).

As described above, the battery 20A (one example of a rechargeable battery) according to the present embodiment includes the control unit 210A (one example of a charging controller). The control unit 210A measures the internal resistance of the battery 20A and updates the full charge capacity of the battery 20A based on the charged capacity after the point in time (for example, peak) that is specified based on the change in internal resistance during charge.

Thus, the battery 20A can recognize and update the full charge capacity in a charge in a charging region that is frequently used also in practical use, by making use of the change in internal resistance during charge without being completely discharged. The battery 20A can therefore appropriately update the full charge capacity in practical use. In addition, the battery 20A or the electronic device 10 can always notify a user of a highly accurate remaining capacity even though the full charge capacity of the battery 20A changes due to deterioration over time etc.

For example, the charging rate at the point in time at which the internal resistance of the battery 20A becomes minimum during charge is preset. Then, the control unit 210A updates the full charge capacity of the battery 20A based on the charged capacity from the point in time at which the internal resistance becomes minimum during charge until the fully charged state is reached and the preset charging rate.

Thus, the battery 20A can recognize and update, in a time period during charge, the full charge capacity in a partial charge that is frequently used also in practical use, by making use of the charging rate at the point in time at which the internal resistance becomes minimum being decided.

It is to be noted that the detection unit 215A may detect a point at which the internal resistance becomes maximum, instead of or in addition to the point at which the internal resistance becomes minimum during charge. For example, instead of or in addition to the charging rate (for example, 80%) of the battery 20A at the point in time at which the internal resistance becomes minimum during charge, the charging rate (for example, 95%) of the battery 20A at the point in time at which the internal resistance becomes maximum is preset. Then, the calculation unit 216A may calculate the full charge capacity based on the charged capacity from the point in time at which the internal resistance becomes maximum until the fully charged state is reached, instead of calculating the full charge capacity based on the charged capacity from the point in time at which the internal resistance becomes minimum during charge until the fully charged state is reached. In addition, the calculation unit 216A may calculate the full charge capacity based on the charged capacity from the point in time at which the internal resistance becomes minimum to the point in time at which the internal resistance becomes maximum during charge.

Figure 11:
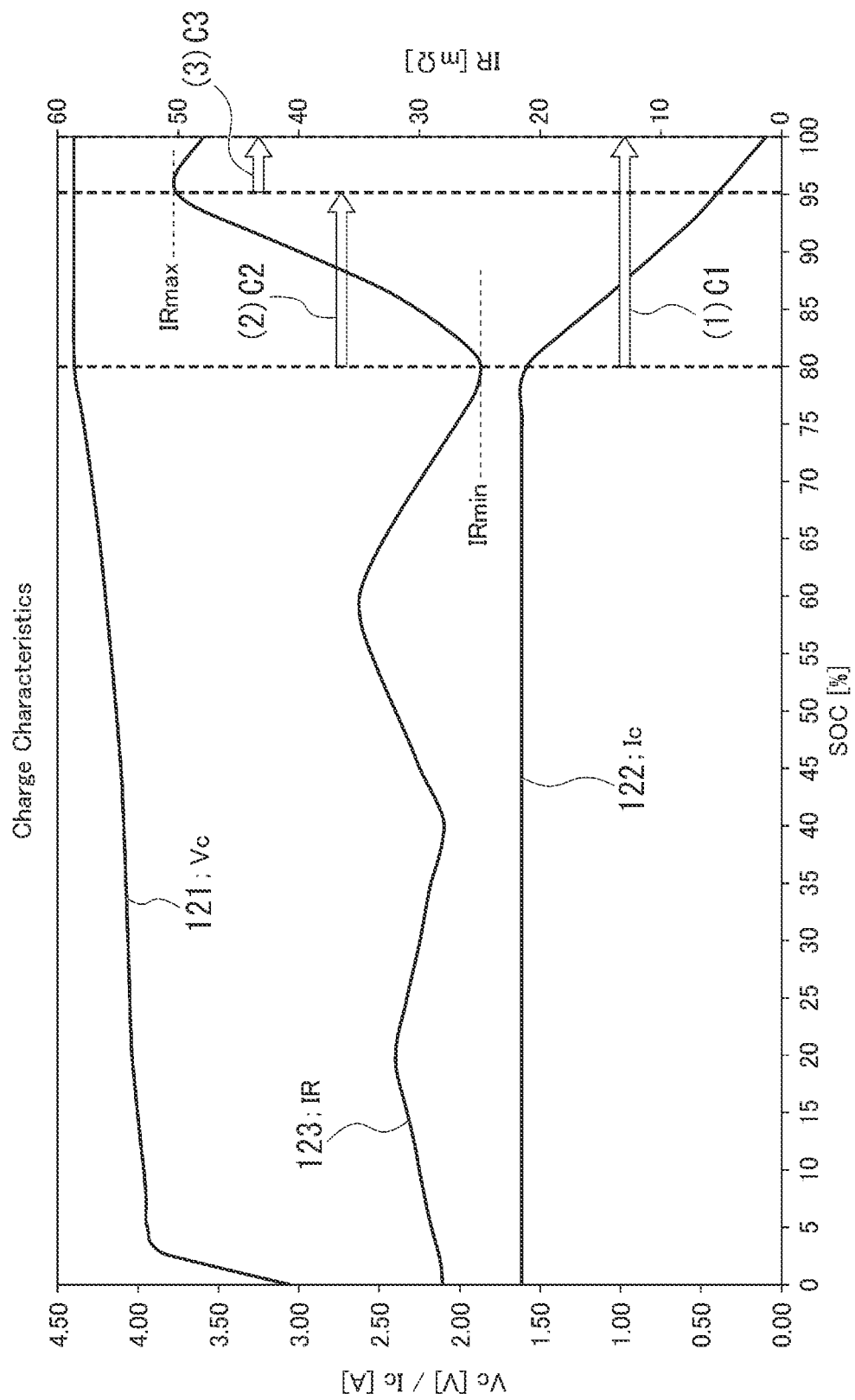
FIG. 11 is a view illustrating three examples of measurement time periods of a charged capacity according to the second embodiment.

FIG. 11 is a view illustrating three examples of measurement time periods of a charged capacity for calculating the full charge capacity. (1) illustrates a measurement time period of a charged capacity when the full charge capacity is calculated using a measurement result C1 of the charged capacity from the point in time at which the internal resistance becomes minimum (the charging rate of 80%) until the fully charged state is reached (the charging rate of 100%). (2) illustrates a measurement time period of a charged capacity when the full charge capacity is calculated using a measurement result C2 of the charged capacity from the point in time at which the internal resistance becomes minimum (the charging rate of 80%) to the point in time at which the internal resistance becomes maximum (the charging rate of 95%). (3) illustrates a measurement time period of a charged capacity when the full charge capacity is calculated using a measurement result C3 of the charged capacity from the point in time at which the internal resistance becomes maximum (the charging rate of 95%) until the fully charged state is reached (the charging rate of 100%).

In this way, the charging rate of the battery 20A at the point in time at which the internal resistance becomes maximum during charge is preset, and the control unit 210A may update the full charge capacity of the battery 20A based on the charged capacity from the point in time at which the internal resistance becomes maximum during charge until the fully charged state is reached and the preset charging rate.

Thus, the battery 20A can recognize and update, in a time period during charge, the full charge capacity in a partial charge that is frequently used also in practical use, by making use of the charging rate at the point in time at which the internal resistance becomes maximum being decided.

In addition, the charging rate of the battery 20A at each point in time at which the internal resistance becomes minimum and maximum during charge is preset, and the control unit 210A may update the full charge capacity of the battery 20A based on the charged capacity from the point in time at which the internal resistance becomes minimum to the point in time at which the internal resistance becomes maximum during charge and the preset charging rates.

Thus, the battery 20A can recognize and update, in a time period during charge, the full charge capacity in a partial charge that is frequently used also in practical use, by making use of the charging rates at the points of time at which the internal resistance becomes minimum and maximum being decided.

It is to be noted that, of a plurality of peaks occurring in the change in internal resistance during charge, a peak other than a minimum peak or maximum peak may be used as a start point or end point of measurement of the charged capacity.

Third Embodiment

Next, the third embodiment of the present invention is described.

While the example of updating the full charge capacity making use of the change in internal resistance of the battery 20A is described in the second embodiment, an internal resistance measurement method is described in detail in the present embodiment.

Figure 12:
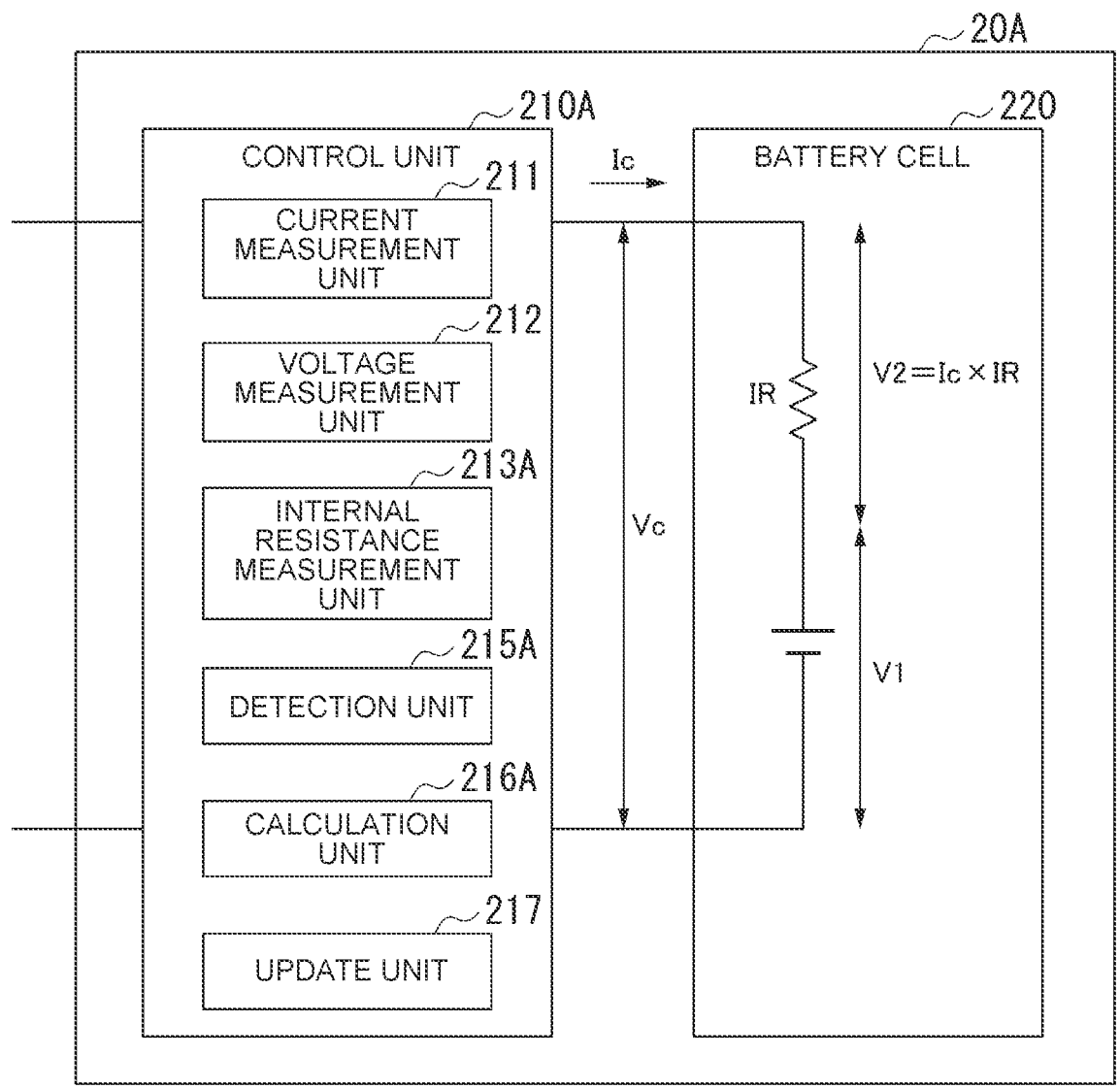
FIG. 12 is a block diagram of a battery illustrating an equivalent circuit of a battery cell according to a third embodiment.

FIG. 12 is a block diagram of the battery 20A illustrating an equivalent circuit of a battery cell 220 according to the present embodiment. In this drawing, parts corresponding to those in FIG. 8 are denoted by the same symbols, and a description thereof is omitted. An internal resistance (IR) as illustrated is a resistance component in the battery cell 220. Since a current flows through the internal resistance (IR) during charge, a voltage (V2) is generated. A battery voltage (Vc) of the battery 20A is therefore different between when a charging current (Ic) is flowing (during charge) and when it is not flowing (during no charge). When the charging current (Ic) is flowing, the battery voltage (Vc) is a sum of a voltage (V1) by a voltage source of the battery cell 220 and the voltage (V2=IR×Ic) to be generated by the internal resistance (IR). On the other hand, when the charging current (Ic) is not flowing, the battery voltage (Vc) is the voltage (V1) by the voltage source of the battery cell 220. The internal resistance measurement unit 213A can therefore measure the battery voltage (Vc) when the charging current (Ic) is flowing and the battery voltage (Vc) when the charging current (Ic) is not flowing and measure the internal resistance (IR) based on a difference between them.

Figure 13:
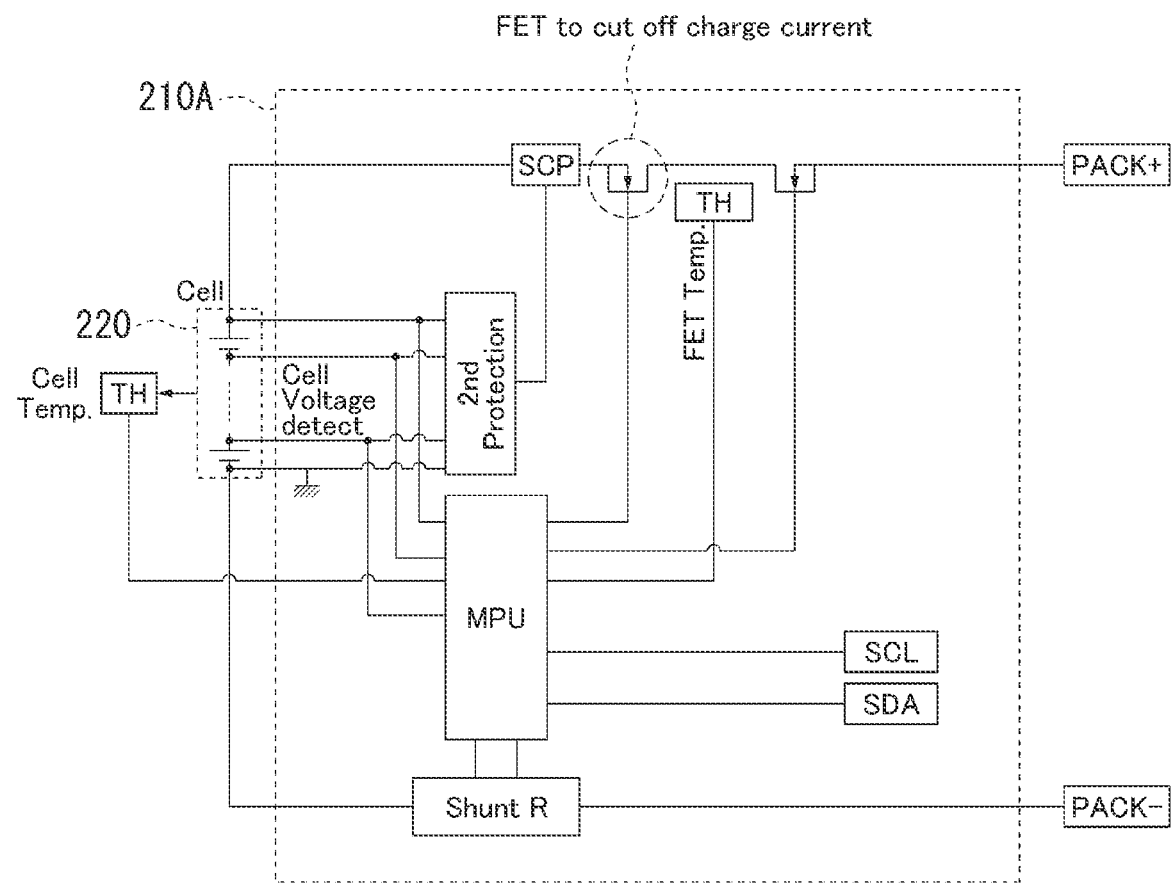
FIG. 13 is a schematic view illustrating one example of an overview of an internal circuit of a control unit according to the third embodiment.

FIG. 13 is a schematic view illustrating one example of an overview of an internal circuit of the control unit 210A according to the present embodiment. The control unit 210A includes an MPU, an SCP (Self Control Protector), a Safety IC, a Thermistor, and an FET etc. The control unit 210A measures the battery voltage (Vc) when the charging current (Ic) is flowing and also measures the battery voltage (Vc)

when the charging current (Ic) is not flowing by temporarily cutting off the FET that is connected to a charging path to the battery cell 220, during a charging period.

The internal resistance measurement unit 213A calculates, by temporarily stopping the charging current during a charging period of the battery 20A, the internal resistance (IR) of the battery 20A based on a difference between the voltage of the battery 20A before the stoppage and that of the battery 20A during the stoppage. A detailed description is made with reference to FIG. 14.

Figure 14:
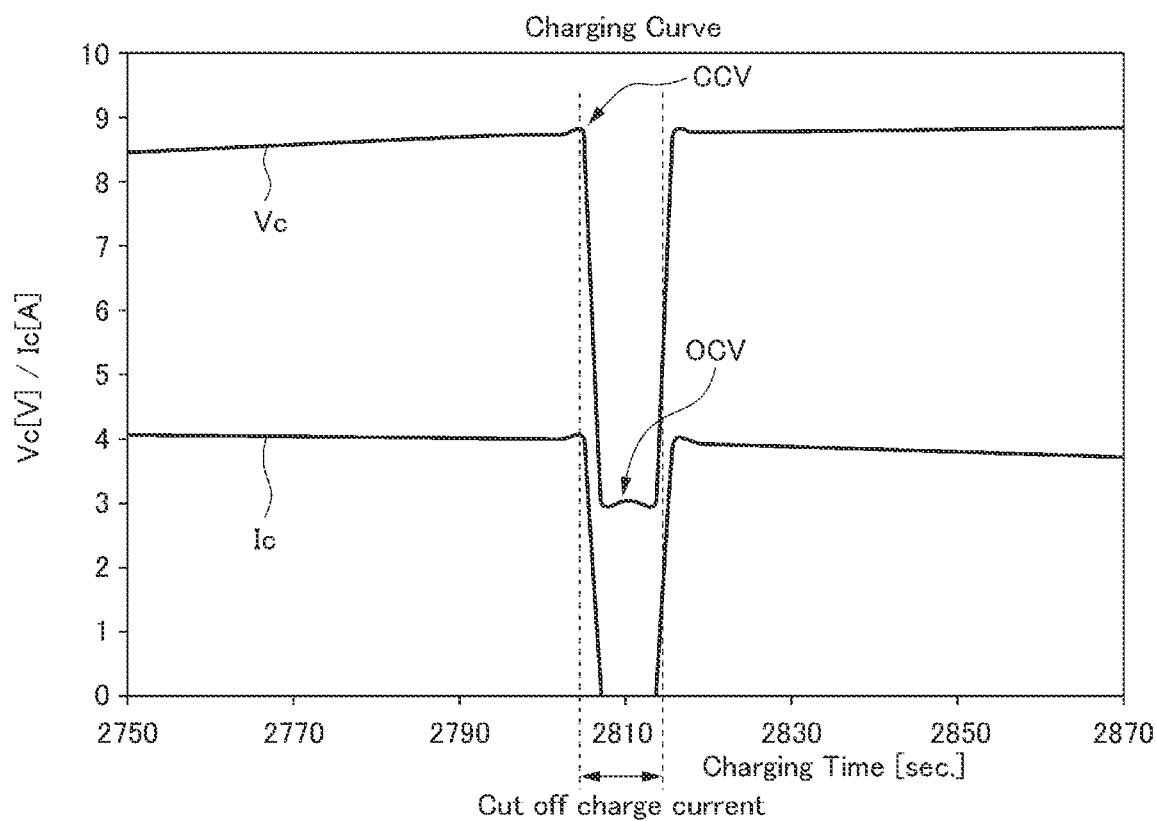
FIG. 14 is a graph illustrating voltage and current waveforms when the internal resistance is measured according to the third embodiment.

FIG. 14 is a graph illustrating voltage and current waveforms when the internal resistance is measured according to the present embodiment. In this graph, the battery voltage (Vc=V1+V2) when the charging current (Ic) is flowing is denoted by CCV (Closed Circuit Voltage). In addition, the battery voltage (Vc=V1) when the FET is temporarily controlled to OFF (Cut off) and thus the charging current (Ic) is not flowing is denoted by OCV (Open Circuit Voltage). The internal resistance (IR) can be calculated by the following Formula 3.

$$IR=(CCV-OCV)/Ic \qquad \text{(Formula 3)}$$

Figure 15:
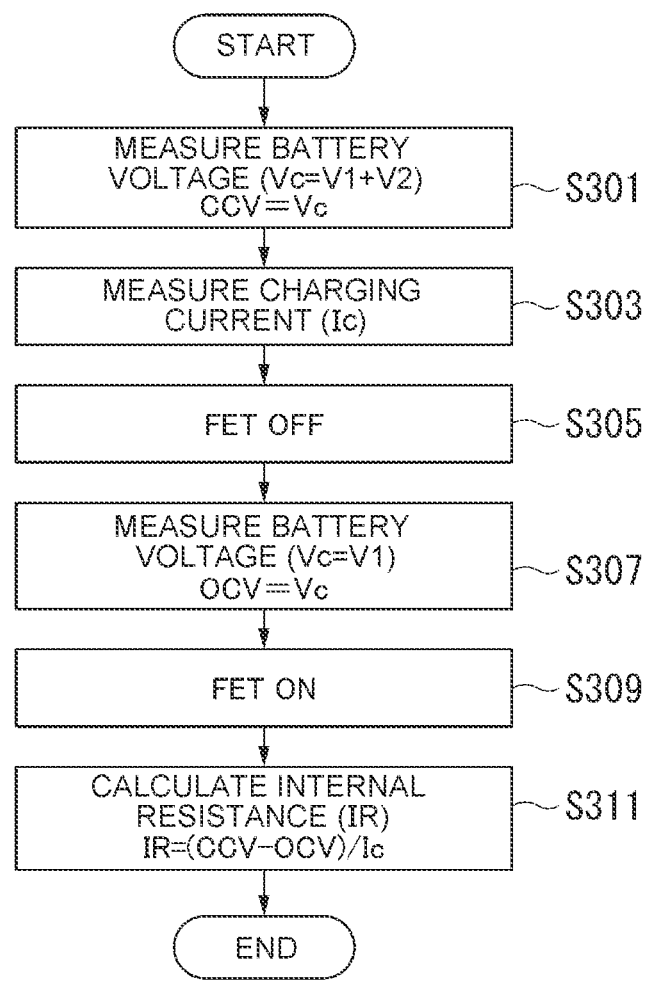
FIG. 15 is a flow chart illustrating one example of an internal resistance measurement process according to the third embodiment.

FIG. 15 is a flow chart illustrating one example of an internal resistance measurement process according to the present embodiment. An operation of the internal resistance measurement process to be carried by the control unit 210A is described with reference to this FIG. 15. This internal resistance measurement process is carried out during a charging period of the battery 20A.

(Step S301) The control unit 210A measures the battery voltage (Vc=V1+V2) and assigns a measurement value to CCV. Then, it proceeds to a process in step S303.

(Step S303) The control unit 210A measures the charging current (Ic) and proceeds to a process in step S305.

(Step S305) The control unit 210A controls the FET to OFF and stops a supply of the charging current (Ic) to the battery cell 220. Then, it proceeds to a process in step S307.

(Step S307) The control unit 210A measures the battery voltage (Vc=V1) and assigns a measurement value to OCV. Then, it proceeds to a process in step S309.

(Step S309) The control unit 210A controls the FET to ON and restarts a supply of the charging current (Ic) to the battery cell 220. Then, it proceeds to a process in step S311.

(Step S311) The control unit 210A calculates the internal resistance (IR) using the measurement values CCV, OCV, and Ic by the Formula 3.

The control unit 210A carries out the above-described measurement process multiple times over the charging period of the battery 20A. Thus, the internal resistance measurement unit 213A measures the internal resistance of the battery 20A multiple times over the charging period of the battery 20A. The detection unit 215A detects a peak of the internal resistance based on a change in the internal resistance measured by the internal resistance measurement unit 213A. For example, when an amount of change in the value of the internal resistance measured by the internal resistance measurement unit 213A over multiple times has become less than or equal to a predetermined threshold value (for example, 0 mΩ or less than or equal to 2 mΩ), the detection unit 215A detects as a peak.

In addition, the internal resistance measurement unit 213A changes a measurement frequency (measurement period) of the internal resistance when detecting the peak of the internal resistance. Since the charging current is temporarily stopped when the internal resistance is measured, as mentioned above, a continuous and highly frequent measurement may influence a charging time until the fully charged state is reached. Therefore, during a time period corresponding to the vicinity of a peak to be detected, measurement accuracy is increased by high frequency measurement, while during the rest time period, an influence on the charging time is suppressed by lowering the measurement frequency.

Figure 16:
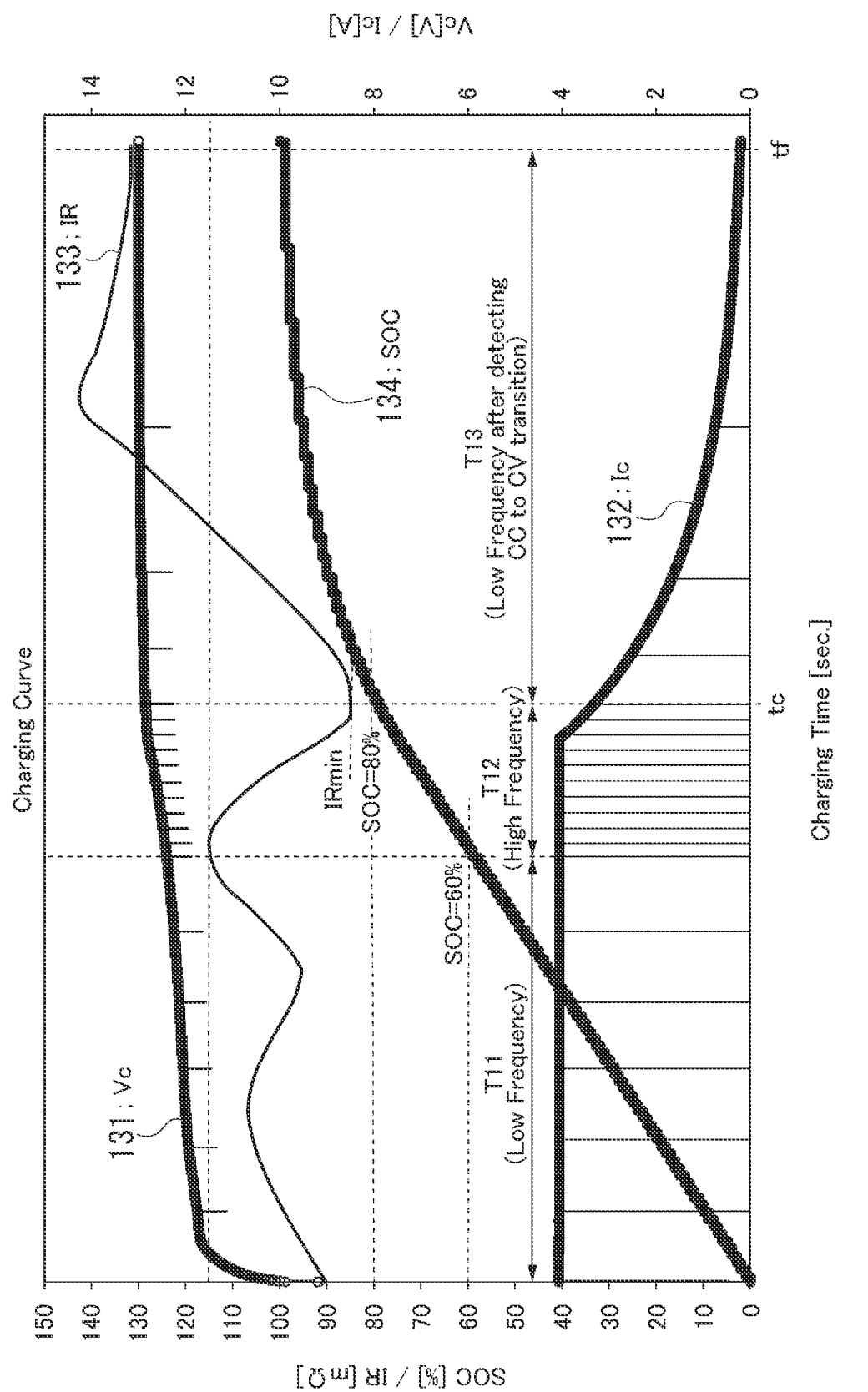
FIG. 16 is a graph illustrating a first example of measurement timing of the internal resistance according to the third embodiment.

FIG. 16 is a graph illustrating a first example of measurement timing of the internal resistance during a charging period according to the present embodiment. This drawing illustrates the measurement timing of the internal resistance when a point (time tc) at which the internal resistance becomes minimum (IRmin) is detected. In this drawing, a horizontal axis represents a charging time, a curve denoted by a symbol 131 represents a battery voltage (Vc [V]), a curve denoted by a symbol 132 represents a charging current (Ic [A]), a curve denoted by a symbol 133 represents an internal resistance (IR [mΩ]), and a curve denoted by a symbol 134 represents a charging rate (SOC [%]).

The internal resistance measurement unit 213A measures the internal resistance (IR) at a low period (for example, every time the SOC increases by 10%) during a time period T11 in which the charging rate (SOC) is less than 60%. In addition, when the charging rate (SOC) becomes greater than or equal to 60%, the internal resistance measurement unit 213A raises the measurement frequency of the internal resistance. For example, when the charging rate (SOC) reaches 60%, the internal resistance measurement unit 213A measures the internal resistance (IR) every time the SOC increases by 1%. It is to be noted that the battery voltage (Vc) when the charging rate (SOC) becomes 60% is set as a predetermined threshold value, and the internal resistance measurement unit 213A may raise the measurement frequency of the internal resistance (IR) when the battery voltage (Vc) measured by the voltage measurement unit 212 has reached the predetermined threshold value.

In addition, the internal resistance measurement unit 213A lowers the measurement frequency upon detection of a peak (minimum point) of the internal resistance (IR) by the detection unit 215A, that is, the internal resistance measurement unit 213A lowers the measurement frequency during the time period T11 in which the charging rate (SOC) is less than 60%, raises the measurement frequency during a time period T12 from the time at which the charging rate (SOC) has reached 60% until a point at which the internal resistance (IR) becomes minimum is detected, and again lowers the measurement frequency after the minimum point is detected. This can suppress the influence on the charging time until the fully charged state is reached (the charging time from becoming longer) while increasing the accuracy of the point to be detected. It is to be noted that the internal resistance measurement unit 213A may further lower the measurement frequency during the time period T13 than that during the time period T11. In addition, the internal resistance measurement unit 213A may gradually lower the measurement frequency with the lapse of the charging time or may stop measuring, during the time period T13.

It is to be noted that hereinafter a measurement mode in which the measurement frequency of the internal resistance is low may be referred to as a low period measurement mode, and a measurement mode in which the measurement frequency of the internal resistance is high may be referred to as a high period measurement mode.

Next, an operation of an internal resistance peak detection process that changes the measurement frequency (measurement period) of the internal resistance to detect a point at which the internal resistance becomes minimum is described with reference to FIG. 17.

Figure 17:
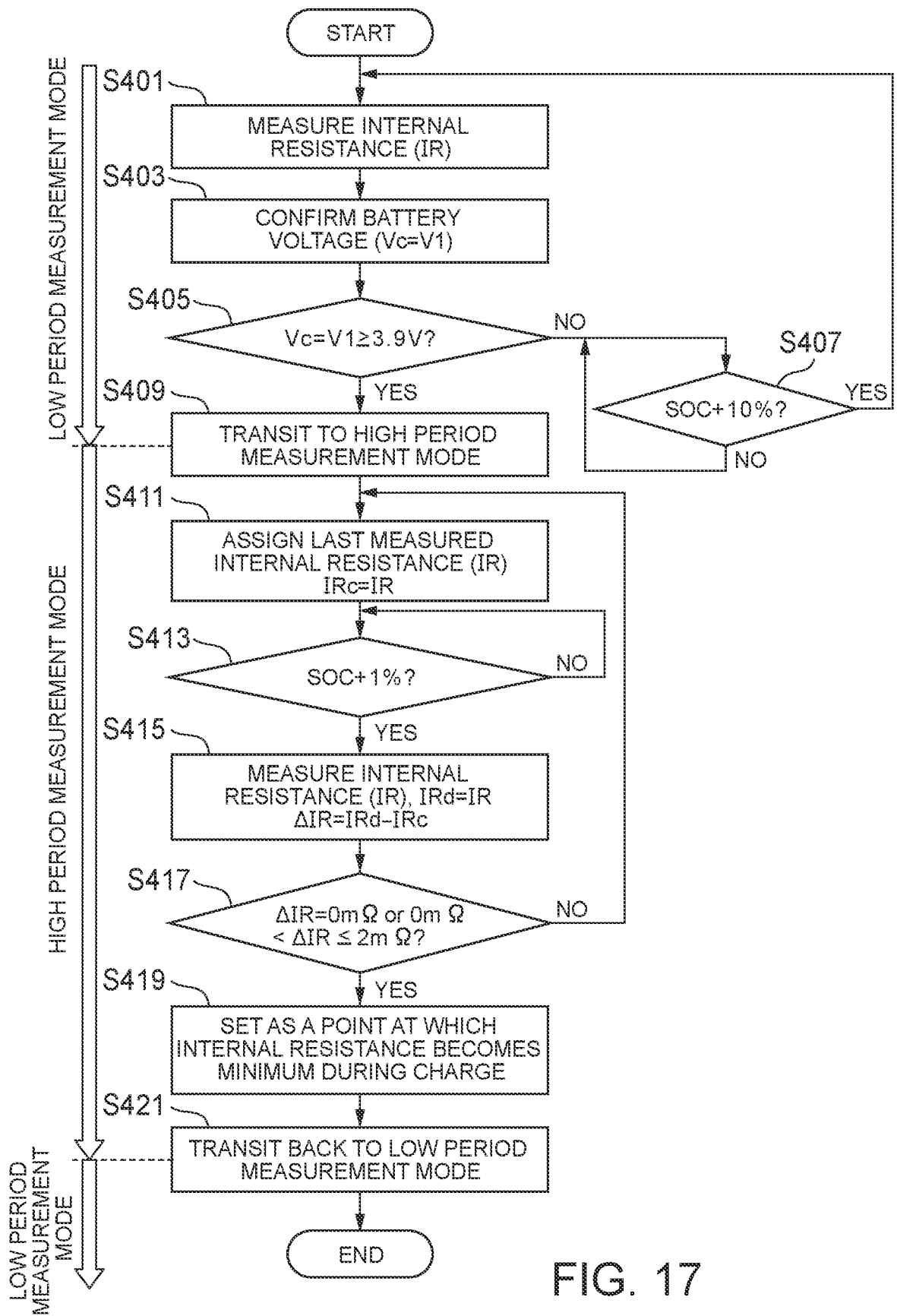
FIG. 17 is a flow chart illustrating an example of an internal resistance peak detection process according to the third embodiment.

FIG. 17 is a flow chart illustrating one example of the internal resistance peak detection process according to the present embodiment. This internal resistance peak detection process is started in response to a start of charge of the battery 20A. The battery 20A is set to the low period measurement mode at the start point in time.

(Step S401) The control unit 210A measures the internal resistance (IR) of the battery 20A. Specifically, the control unit 210A measures the internal resistance (IR) by carrying out the internal resistance measurement process as illustrated in FIG. 15. Then, it proceeds to a process in step S403.

(Step S403) The control unit 210A confirms the battery voltage (Vc=V1) when the charging current (Ic) is not flowing. This battery voltage (Vc=V1) is a voltage measured in the internal resistance measurement process carried out in step S401. Then, it proceeds to a process in step S405.

(Step S405) The control unit 210A determines whether or not the battery voltage (Vc=V1) measured in step S401 is greater than or equal to 3.9 V. This 3.9 V is, for example, one example of the battery voltage (Vc=V1) when the charging rate (SOC) has reached 60%. That is, the control unit 210A determines in this determination process whether or not the charging rate (SOC) has reached 60%. When the control unit 210A determines that the battery voltage (Vc=V1) is less than 3.9 V (NO), it proceeds to a process in step S407. On the other hand, the control unit 210A determines that the battery voltage (Vc=V1) is greater than or equal to 3.9 V (YES), it proceeds to a process in step S409.

(Step S407) The control unit 210A determines whether or not the charging rate (SOC) has increased by 10%. While the charging rate (SOC) has not increased by 10% (NO), the control unit 210A waits, and when the control unit 210A determines that the charging rate (SOC) has increased by 10% (YES), it returns to the process in step S401 and measures the internal resistance (IR) of the battery 20A. That is, when the battery voltage (Vc=V1) is less than 3.9 V (the time period T11 in FIG. 16), the control unit 210A measures the internal resistance (IR) every time the charging rate (SOC) increases by 10% (low period measurement mode). It is to be noted that this period to measure every time the charging rate (SOC) increases by 10% is one example of the measurement period in the low period measurement mode, and the measurement period is not limited thereto. On the other hand, when the control unit 210A determines that the charging rate (SOC) has increased by 10% (YES), it proceeds to a process in step S409.

(Step S409) The control unit 210A transits the low period measurement mode to the high period measurement mode. Then, it proceeds to a process in step S411.

(Step S411) The control unit 210A assigns a last measured internal resistance (IR) to IRc and proceeds to a process in step S413. The last measured internal resistance (IR) means a measurement value of the internal resistance IR when it is determined in step S405 that the battery voltage (Vc=V1) is greater than or equal to 3.9 V. In subsequent processes, the control unit 210A measures the internal resistance and detects the amount of change in the internal resistance ΔIR every time the charging rate (SOC) increases by 1%.

(Step S413) The control unit 210A determines whether or not the charging rate (SOC) has increased by 1%. While the charging rate (SOC) has not increased by 1% (NO), the control unit 210A waits, and when the control unit 210A determines that the charging rate (SOC) has increased by 1% (YES), it proceeds to a process in step S415. It is to be noted that this period to measure every time the charging rate (SOC) increases by 1% is one example of the measurement period in the high period measurement mode, and the measurement period is not limited thereto. The measurement period of the high period measurement mode only needs to be higher than that of the low period measurement mode.

(Step S415) The control unit 210A measures the internal resistance (IR) and assigns the measurement value to IRd. Then, the control unit 210A calculates an amount of change in the internal resistance ΔIR (ΔIR=IRd−IRc) and proceeds to a process in step S417.

(Step S417) The control unit 210A determines whether or not it is a point at which the internal resistance becomes minimum, based on the amount of change in the internal resistance ΔIR calculated in step S415. For example, when the amount of change in the internal resistance ΔIR is greater than or equal to 0 mΩ and less than or equal to 2 mΩ (ΔIR=0 mΩ or 0 mΩ<ΔIR≤2 mΩ), the control unit 210A determines that it is the point at which the internal resistance becomes minimum. When the control unit 210A determines that it is not the point at which the internal resistance becomes minimum (NO), it returns to the process in step S411 and assigns the value IRd of the internal resistance last measured to IRc. Then, the control unit 210A measures again the internal resistance (IR) after increase in the charging rate (SOC) of 1% and determines whether or not it is the point at which the internal resistance becomes minimum. On the other hand, when the control unit 210A determines that it is the point at which the internal resistance becomes minimum (YES), it proceeds to a process in step S419.

(Step S419) The control unit 210A sets as the point at which the internal resistance becomes minimum during charge. That is, the control unit 210A sets as a start point of integration of the charged capacity. Then, it proceeds to a process in step S421.

(Step S421) The control unit 210A transits the high period measurement mode back to the low period measurement mode. It is to be noted that the control unit 210A may transit it back to the same measurement period as that in the low period measurement mode in steps S401 to S409 and may make it much lower. In addition, the control unit 210A may gradually lower the measurement frequency with the lapse of the charging time or may stop measuring before the fully charged state is reached.

It is to be noted that although the example of transition to the high period measurement mode when the point at which the internal resistance becomes minimum is detected is described with reference to FIG. 16 and FIG. 17, a transition to the high period measurement mode may also be made when another peak of the internal resistance is detected.

Figure 18:
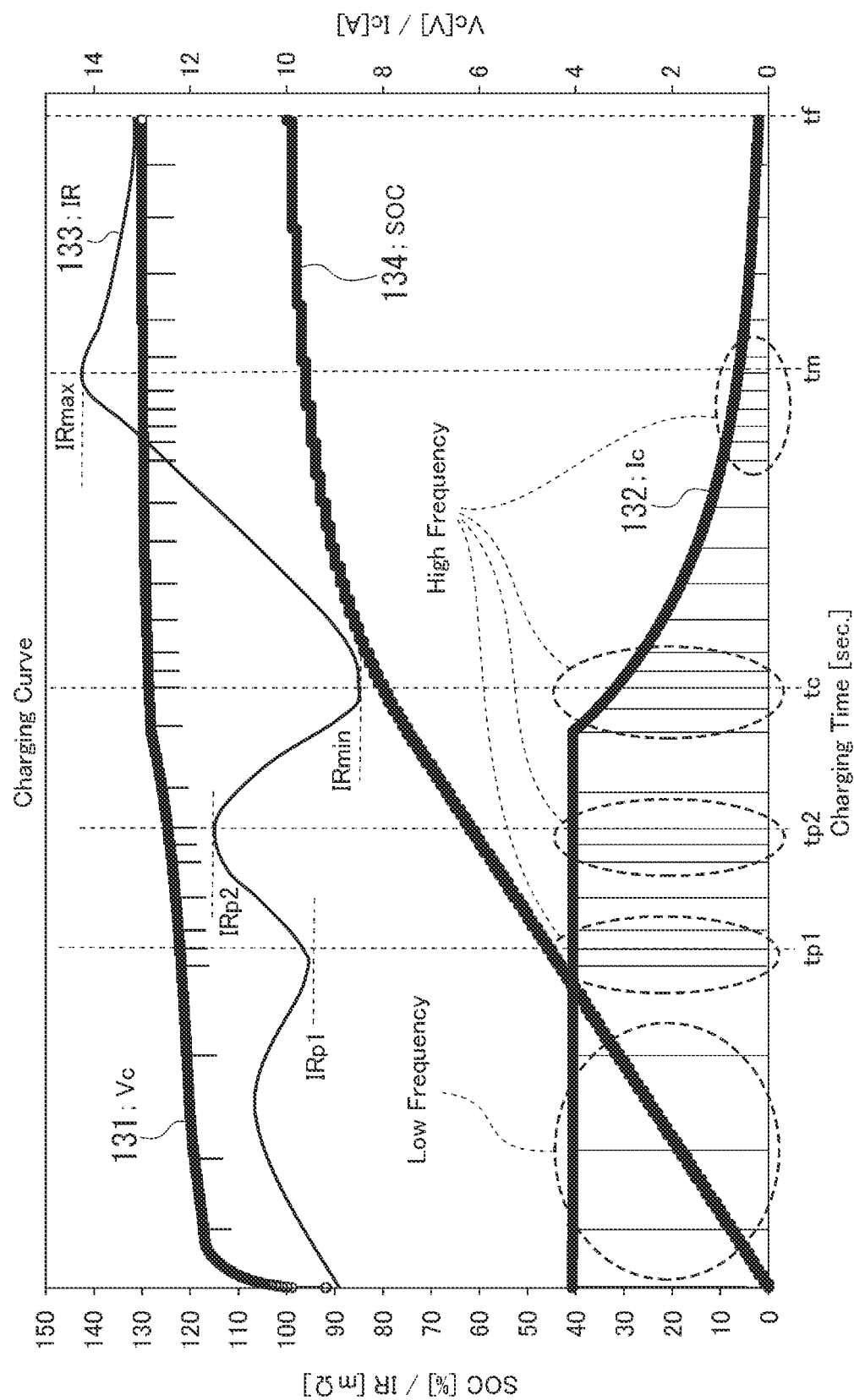
FIG. 18 is a graph illustrating a second example of measurement timing of the internal resistance according to the third embodiment.

FIG. 18 is a graph illustrating a second example of measurement timing of the internal resistance during a charging period according to the present embodiment. In this drawing, as with FIG. 16, a horizontal axis represents a charging time, a curve denoted by a symbol 131 represents a battery voltage (Vc [V]), a curve denoted by a symbol 132 represents a charging current (Ic [A]), a curve denoted by a symbol 133 represents an internal resistance (IR [mΩ]), and a curve denoted by a symbol 134 represents a charging rate (SOC [%]).

In an illustrated example, a transition from the low period measurement mode to the high period measurement mode is also made when a point (time tm) at which the internal resistance becomes maximum (IRmax) is detected in addition to the point (time tc) at which the internal resistance becomes minimum (IRmin). In addition, the transition from the low period measurement mode to the high period measurement mode is also made when two peaks (IRp1 and IRp2) before the point at which the internal resistance becomes minimum are detected. In this way, the control unit 210A transits the low period measurement mode to the high period measurement mode for a time period from timing shortly before a peak to be detected until the peak is detected. The peak to be detected may be either one or both of the point at which the internal resistance becomes minimum and that at which the internal resistance becomes maximum, or may be, instead of or in addition to these, a peak (for example, IRp1, IRp2 etc.) before the point at which the internal resistance becomes minimum.

As described above, the control unit 210A of the battery 20A (one example of a rechargeable battery) according to the present embodiment measures the internal resistance of the battery 20A multiple times over the charging period of the battery 20A and detects a peak of the internal resistance based on a change in the measured internal resistance. In addition, the control unit 210A detects the full charge capacity of the battery 20A with reference to the detected peak of the internal resistance.

Thus, the battery 20A can accurately detect a peak of the internal resistance. In addition, the battery 20A can accurately detect the full charge capacity in a charge in a charging region that is frequently used also in practical use without being completely discharged, by detecting the peak of the internal resistance.

In addition, when the amount of change in the value of the internal resistance measured during the charging period of the battery 20A over multiple times has become less than or equal to a predetermined threshold value (for example, 0 mΩ or less than or equal to 2 mΩ), the control unit 210A detects as a peak of the internal resistance.

Thus, the battery 20A can easily and accurately detect the peak of the internal resistance.

In addition, the control unit 210A measures a voltage of the battery 20A, and raises the measurement frequency of the internal resistance when the battery voltage measured during the charging period of the battery 20A has reached a predetermined threshold value (for example, 3.9 V).

Thus, since the battery 20A raises the measurement frequency only during some of the charging period, it can accurately detect a peak of the internal resistance while suppressing the influence on the charging time.

In addition, the control unit 210A lowers the measurement frequency in response to the detection of the peak of the internal resistance.

Thus, since the battery 20A lowers the measurement frequency after the detection of the peak of the internal resistance, it can accurately detect the peak of the internal resistance while suppressing the influence on the charging time.

It is to be noted that the control unit 210A calculates, by temporarily stopping the charging current during the charging period of the battery 20A, the internal resistance of the battery 20A based on a difference between the voltage of the battery 20A before the stoppage and that of the battery 20A during the stoppage.

Thus, the battery 20A can easily and accurately detect the internal resistance.

It is to be noted that the control unit 210A may detect a peak of the internal resistance based on the change in the internal resistance measured multiple times and detect a point of switching from the constant current charge to the constant voltage charge referring to the detected peak of the internal resistance. For example, the battery 20A may measure the charging current on the basis of a point at which the internal resistance becomes a peak to detect the point of switching from the constant current charge to the constant voltage charge, or may confirm a temporal correlation between the detected point of switching from the constant current charge to the constant voltage charge and the point in time at which the internal resistance becomes a peak to define the point of switching from the constant current charge to the constant voltage charge.

Thus, the battery 20A can easily and accurately detect the point of switching from the constant current charge to the constant voltage charge by referring to the peak of the internal resistance. The battery 20A can therefore accurately detect the full charge capacity in a charge in a charging region that is frequently used also in practical use without being completely discharged.

Although the embodiments of the present invention have been described above in detail with reference to the drawings, specific configurations are not limited to the above and various design changes etc. can be made without departing from the scope of the present invention. For example, the above configurations described in the respective embodiments may be optionally combined.

It is to be noted that the above-mentioned control units 210 and 210A have a computer system therein. Then, the processes in the respective configurations that the above-mentioned control units 210 and 210A each include may be also executed by recording a program for realizing functions of the respective configurations that the above-mentioned control units 210 and 210A each include in a computer readable recording medium, making the computer system read the program that is recorded in the recording medium and executing the program. Here, "making the computer system read the program that is recorded in the recording medium and executing the program" includes installation of the program into the computer system. "The computer system" that is described here shall include hardware such as an OS and peripherals. In addition, "the computer system" may also include a plurality of computer devices that are connected over a network including communication lines such as the Internet, a WAN, a LAN, a dedicated line and so forth. In addition, "the computer readable recording medium" means portable media such as a flexible disk, a magneto-optical disk, a ROM, a CD-ROM and so forth and storages such as a hard disk built in the computer system. In this way, the recording medium that stores the program may be a non-transitory recording medium such as the CD-ROM.

In addition, the recording medium also includes internally or externally disposed recording media that are accessible from a distribution server for distribution of the program concerned. It is to be noted that a configuration in which the program is divided into a plurality of parts to be downloaded at mutually different timings, and thereafter respective configurations that the control units 210 and 210A include integrate the divided parts of the program together may be adopted, and the distribution servers that distribute the divided parts of the program respectively may be different from one another. Further, "the computer readable recording medium" shall also include a medium that holds the program for a definite period of time, such as the server in a case where the program is transmitted over the network and a volatile memory (a RAM) in the computer system that serves as a client. In addition, the above-described program may be also the one that is adapted to implement some of the above-mentioned functions. Further, the program may be also the one that is able to implement the above-mentioned functions by being combined with a program that is already recorded in the computer system, that is, a so-called differential file (differential program).

In addition, some or all of the respective functions that the control units 210 and 210A according to the above-mentioned embodiments include may be realized as an integrated circuit such as an LSI (Large Scale Integration). The respective functions may be individually processorized and some or all of the functions may be integrated with one another and then processorized. In addition, an approach for circuit integration may be realized by a dedicated circuit, a general-purpose processor and so forth, not limited to the LSI. In addition, in a case of appearance of a technique for realizing an integrated circuit that would take the place of the LSI owing to progress of the semiconductor technology, the integrated circuit realized by the above-described technique may be used.

In addition, although the example in which the electronic device 10 is a clamshell PC (or a tablet PC or a smartphone) etc. is described in the above-mentioned embodiments, it is not limited to a PC or smartphone if it is a device that is operated by power supply from a rechargeable battery. For example, the electronic device 10 may be a cellular phone, a game console, a vacuum cleaner, a drone, an electric vehicle, a hybrid vehicle, an electric bicycle etc.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS 10 electronic device
20, 20A battery
210, 210A control unit
220 battery cell
211 current measurement unit
212 voltage measurement unit
213A internal resistance measurement unit
215, 215A detection unit
216, 216A calculation unit
217 update unit

The invention claimed is:

1. A charging controller, comprising:
a current measurement unit configured to measure a charging current of a rechargeable battery;
an internal resistance measurement unit configured to measure an internal resistance of the rechargeable battery multiple times over a charging period of the rechargeable battery;
a detection unit configured to detect switching from a constant current charge to a constant voltage charge based on the charging current measured by the current measurement unit, during charge of the rechargeable battery, wherein the detection unit detects a peak of the internal resistance based on a change in the internal resistance measured by the internal resistance measurement unit and detects a point of switching from the constant current charge to the constant voltage charge while referring to the detected peak of the internal resistance; and
an update unit configured to update a full charge capacity of the rechargeable battery based on a charged capacity after a point in time, detected by the detection unit, of switching from the constant current charge to the constant voltage charge, wherein
by temporarily stopping the charging current during the charging period of the rechargeable battery, the internal resistance measurement unit calculates the internal resistance of the rechargeable battery based on a difference between a voltage of the rechargeable battery before a stoppage and that of the rechargeable battery during the stoppage.

2. The charging controller according to claim 1, wherein
a charging rate, at the point in time of switching from the constant current charge to the constant voltage charge during charge, is preset,
the charging rate is a ratio of the charged capacity to the full charge capacity, and
the update unit updates the full charge capacity of the rechargeable battery based on the charged capacity from the point in time detected by the detection unit until a fully charged state is reached and the preset charging rate.

3. The charging controller according to claim 2, wherein
the current measurement unit measures the charging current of the rechargeable battery at a predetermined period, and
the detection unit detects switching from the constant current charge to the constant voltage charge when a measurement value of the charging current measured by the current measurement unit at e very predetermined period has continuously decreased from a previous measurement value by greater than or equal to a certain value for a predetermined number of times.

4. A charging controller, comprising:
a current measurement unit configured to measure a charging current of a rechargeable battery;
an internal resistance measurement unit configured to measure an internal resistance of the rechargeable battery multiple times over a charging period of the rechargeable battery;
a detection unit configured to detect switching from a constant current charge to a constant voltage charge based on the charging current measured by the current measurement unit, during charge of the rechargeable battery, wherein the detection unit detects a peak of the internal resistance based on a change in the internal resistance measured by the internal resistance measurement unit and detects a point of switching from the constant current charge to the constant voltage charge while referring to the detected peak of the internal resistance;
an update unit configured to update a full charge capacity of the rechargeable battery based on a charged capacity after a point in time, detected by the detection unit, of switching from the constant current charge to the constant voltage charge; and
a voltage measurement unit configured to measure a voltage of the rechargeable battery,
wherein the internal resistance measurement unit raises a measurement frequency of the internal resistance when the voltage measured by the voltage measurement unit during the charging period of the rechargeable battery has reached a predetermined threshold value.

5. The charging controller according to claim 4, wherein
the internal resistance measurement unit lowers the measurement frequency in response to the detection of the peak of the internal resistance by the detection unit.

6. A charging controller, comprising:
a current measurement unit configured to measure a charging current of a rechargeable battery;
an internal resistance measurement unit configured to measure an internal resistance of the rechargeable battery multiple times over a charging period of the rechargeable battery;

a detection unit configured to detect switching from a constant current charge to a constant voltage charge based on the charging current measured by the current measurement unit, during charge of the rechargeable battery, wherein the detection unit detects a peak of the internal resistance based on a change in the internal resistance measured by the internal resistance measurement unit and detects a point of switching from the constant current charge to the constant voltage charge while referring to the detected peak of the internal resistance; and an update unit configured to update a full charge capacity of the rechargeable battery based on a charged capacity after a point in time, detected by the detection unit, of switching from the constant current charge to the constant voltage charge, wherein the detection unit detects the peak when an amount of change in a value of the internal resistance measured by the internal resistance measurement unit over multiple times has become less than or equal to a predetermined threshold value.

7. A control method in a charging controller, comprising steps of:

measuring, by a current measurement unit, a charging current of a rechargeable battery;

measuring, by an internal resistance measurement unit, an internal resistance of the rechargeable battery multiple times over a charging period of the rechargeable battery;

detecting, by a detection unit, switching from a constant current charge to a constant voltage charge based on the charging current measured by the current measurement unit, during charge of the rechargeable battery;

detecting, by the detection unit, a peak of the internal resistance based on a change in the internal resistance measured by the internal resistance measurement unit and further detecting a point of switching from the constant current charge to the constant voltage charge while referring to the detected peak of the internal resistance;

updating, by an update unit, a full charge capacity of the rechargeable battery based on a charged capacity after the point in time, detected by the detection unit, of switching from the constant current charge to the constant voltage charge; and by temporarily stopping the charging current during the charging period of the rechargeable battery, calculating, by the internal resistance measurement unit, the internal resistance of the rechargeable battery based on a difference between a voltage of the rechargeable battery before a stoppage and that of the rechargeable battery during the stoppage.

* * * * *